United States Patent [19]
Yetter et al.

[11] Patent Number: 5,434,520
[45] Date of Patent: Jul. 18, 1995

[54] CLOCKING SYSTEMS AND METHODS FOR PIPELINED SELF-TIMED DYNAMIC LOGIC CIRCUITS

[75] Inventors: Jeffry D. Yetter, Fort Collins; Robert H. Miller, Jr., Loveland, both of Colo.

[73] Assignee: Hewlett-Packard Company, Palo Alto, Calif.

[21] Appl. No.: 885,800

[22] Filed: May 19, 1992

Related U.S. Application Data

[63] Continuation-in-part of Ser. No. 684,637, Apr. 12, 1991, abandoned, and Ser. No. 684,720, Apr. 12, 1991, Pat. No. 5,208,490.

[51] Int. Cl.[6] ......................................... H03K 19/00
[52] U.S. Cl. ........................................ 326/93; 326/97
[58] Field of Search ..................... 395/800, 550, 375; 307/452, 465, 469; 326/93, 97

[56] References Cited

U.S. PATENT DOCUMENTS

| | | | |
|---|---|---|---|
| 3,755,689 | 8/1973 | Elmer et al. | 307/481 |
| 4,841,174 | 6/1989 | Chung et al. | 307/469 |
| 4,949,249 | 8/1990 | Lefsky et al. | 395/550 |
| 5,121,003 | 6/1992 | Williams | 307/452 |
| 5,208,490 | 5/1993 | Yetter | 307/452 |

*Primary Examiner*—Alyssa H. Bowler
*Assistant Examiner*—John Harrity

[57] ABSTRACT

Clocking systems and methods of the present invention use two or more different clock signals for respective groups or stages of self-timed dynamic (or mousetrap) logic gates. Each clock signal defines a precharging time interval and an evaluation time interval for its respective group or stage of self-timed dynamic logic gates. Using the two or more different clock signals, pipelining of the groups or stages of the self-timed dynamic logic gates can be performed.

13 Claims, 22 Drawing Sheets

VECTOR INPUTS:
a=<AH,AL>
b=<BH,BL>
c=<CH,CL>

VECTOR OUTPUTS:
a⊕b=<(a⊕b)H ,(a⊕b)L>
a⊕b⊕c=<(a⊕b⊕c)H ,(a⊕b⊕c)L>

5,434,520

CLOCKING SYSTEMS AND METHODS FOR PIPELINED SELF-TIMED DYNAMIC LOGIC CIRCUITS

The present invention is a continuation-in-part of "UNIVERSAL PIPELINE LATCH FOR MOUSETRAP LOGIC CIRCUITS," by Jeffry Yetter, filed Apr. 12, 1991, having application Ser. No. 07/684,637, abandoned.

The present invention is a continuation-in-part of "A FUNCTIONALLY COMPLETE FAMILY OF SELF-TIMED LOGIC CIRCUITS," by Jeffry Yetter, filed Apr. 12, 1991, having application Ser. No. 07/684,720, now U.S. Pat. No. 5,208,490.

CROSS-REFERENCE TO RELATED APPLICATIONS

1. "A FUNCTIONALLY COMPLETE FAMILY OF SELF-TIMED LOGIC CIRCUITS," by Jeffry Yetter, filed Apr. 12, 1991, having application Ser. No. 07/684,720, now U.S. Pat. No. 5,208,490; and 2. "UNIVERSAL, PIPELINE LATCH FOR MOUSETRAP LOGIC CIRCUITS," by Jeffry Yetter, filed Apr. 12, 1991, having application Ser. No. 07/684,637, abandoned.

BACKGROUND OF THE INVENTION

I. Field of the Invention

The present invention relates generally to logic in computers and, more particularly, to a system and method for clocking pipelined stages of self-timed dynamic logic gates, also known as "mousetrap" logic gates.

II. Related Art

Pipelining in computer logic generally refers to the concept of configuring various stages of logic in sequence, whereby data is initially introduced into the sequence of logic stages and then subsequently more data is introduced before completion of the operation on the first data through the sequence. Pipelining enhances the performance of high "latency" logic networks. High latency logic networks are logic circuits which perform long sequences of logic operations requiring a relatively large amount of time. Pipelining improves performance because pipelining permits the overlapping of operation execution.

At present, pipelining is considered a requirement for high latency logic networks in the high performance arena. For instance, instruction execution logic in the central processing unit (CPU) of a computer invariably employ pipelining.

As a further example of where pipelining is considered a necessity, consider multiplication. To perform multiplication, a "carry save adder" pipeline of logic stages is usually employed. Specifically, each pipeline stage is essentially several rows of conventional full adder logic stages. Moreover, each full adder compresses three partial products into two partial products. Thus, each full adder adds in another partial product as data flows through the chain of full adder logic stages in each pipeline stage. In order to perform a single multiplication operation, more than one clock cycle is usually required, but as a result of pipelining, a new multiplication operation may be commenced generally in substantially less than, perhaps in half of, the total number of clock cycles.

Traditionally, "static" logic gates have been utilized in computers to perform logic functions, for example, mathematical operations. Static logic gates are those which can continuously perform logic operations so long as electrical power is available. In other words, static logic gates need no electrical precharge, or refresh, in order to properly perform logic operations. Static logic gates can be easily connected together in sequence to collectively perform logic functions in an efficient manner.

However, static logic gates are slow individually. In addition, when static logic gates are pipelined, the resulting logic operation is performed in an even slower manner.

"Dynamic" logic gates are also known in the art. Dynamic logic gates are used in the conventional design of logic circuits which require high performance and modest size. Dynamic logic gates are much faster than static logic gates. However, dynamic logic gates require a periodic electrical precharge, or refresh, such as with a dynamic random access memory (DRAM), in order to maintain and properly perform their intended logic function. Once an electrical precharge supplied to a dynamic logic gate has been discharged by the dynamic logic gate, the dynamic logic gate can no longer perform another logic function until subsequently precharged.

However, the use of conventional dynamic logic circuits in combinational logic or pipelining is problematic. First, dynamic logic circuits require a precharge cycle in order to render them operative. Effectively, a precharge cycle periodically interrupts the useful work cycle for the necessary purpose of maintenance. Precharge cycles significantly and undesirably increase the execution time of a sequence of logic stages.

Dynamic logic circuits must maintain a minimum clock frequency in order to insure proper functioning. Proper operation of dynamic logic circuits requires that an electrical charge be deposited and maintained in the circuits. In reality, the charge deposited in the logic circuits eventually will decay to an unknown logic level and thereby corrupt the state of the pipeline. The decay results from uncontrollable design and manufacture characteristics. In most practical situations, the preceding problem may be overcome via a periodic refresh cycle, similar to the refresh cycle in conventional dynamic random access memory (DRAM). Hence, a minimum clock rate, analogous to refresh cycles, must be maintained.

However, the minimum clock rate poses an additional problem. Many times, logic circuits are required to operate arbitrarily slow, "at DC." For instance, logic circuits may be required to operate slow during IC testing. Conventionally, dynamic logic circuits can be modified to exhibit slow operation by including "trickle charge" devices or "cross-coupled negative feedback" devices. However, these devices consume valuable computer real estate and further decrease the speed of the logic circuits.

Thus, a need exists in the industry for teachings that will permit the high performance pipelining of dynamic logic circuitry which adequately preserves data without the need for a minimum (refresh) clock rate.

SUMMARY OF THE INVENTION

The present invention optimizes the flow of self-timed logic evaluations through a plurality of pipeline stages comprised of blocks of self-timed dynamic logic gates. The present invention has particular application to, for example, "mousetrap" logic gates.

In accordance with a first preferred embodiment of the present invention, a first clock signal and a second clock signal both have an evaluation state and a precharge state of shorter time duration, which states are staggered in time. In other words, the second clock precharge state exists during the first clock evaluation state, and vice versa. A first stage of self-timed logic gates receives data and also the first clock signal. The first clock precharge state precharges the self-timed logic gates of the first stage. The first clock evaluation state permits self-timed logic evaluation of the data travelling through the first stage after precharge. A latch receives the data from the first stage and receives the second clock signal. A second stage of self-timed logic gates receives the data from the latch and also receives the second clock signal. The second clock precharge state precharges the self-timed logic gates of the second stage. The second clock evaluation state permits self-timed evaluation of the data travelling through the second stage after precharge.

A second preferred embodiment of the present invention is directed to a pipeline stage having self-timed dynamic logic gates for optimizing the flow of logic evaluations through a series of pipeline stages. In accordance with the second embodiment, a clock signal has a first clock evaluation state and a first clock precharge state. A delayed clock signal has a second clock evaluation state which overlaps with the first clock evaluation state and a second clock precharge state. A stage of self-timed dynamic logic gates receives data. The stage has a first group of cascaded gates connected to the clock signal and a successive second group of cascaded gates connected to the delayed clock signal. The clock signal and the delayed clock signal are configured to permit parallel precharge of the first and second groups of gates. Moreover, the clock signal is configured to permit self-timed logic evaluation in the first group directly after precharge, and the delayed clock signal is configured to permit self-timed logic evaluation in the second group at a predetermined period after precharge.

A third preferred embodiment of the present invention is directed to eliminating the latch of the first preferred embodiment. In accordance with a third embodiment of the present invention, a first clock signal and a second clock signal both have an evaluation state and a precharge state of shorter time duration, which states are staggered in time. In other words, the second clock precharge state exists during the first clock evaluation state, and vice versa. A first stage of self-timed logic gates receives data and also the first clock signal. The first clock precharge state precharges the self-timed logic gates of the first stage. The first clock evaluation state permits self-timed logic evaluation of the data travelling through the first stage after precharge. A second stage of self-timed logic gates receives data and also receives the second clock signal. The second clock precharge state precharges the self-timed logic gates of the second stage. The second clock evaluation state permits self-timed evaluation of the data travelling through the second stage after precharge.

The present invention overcomes the deficiencies of the prior art, as noted above, and further provides for the following additional features and advantages.

Generally, the present invention teaches a system and method for optimizing the pipelining of blocks of self-timed dynamic logic gates, including but not limited to, mousetrap logic gates.

Pipeline stages having varying numbers of cascaded gates, and therefore, requiring different time periods for performing logic evaluations, can be linked together as a result of the clocking system and method in accordance with the present invention.

The present invention permits the pipelining of mousetrap logic gates with broad insensitivity to clock asymmetry, or clock skew, resulting from the use of both clock edges. Specifically, mousetrap logic stages operating in a "disadvantaged" clock phase can steal large time periods from mousetrap logic stages operating in an "advantaged" clock phase. The preceding terms and associated concepts are discussed in specific detail in the Detailed Description section of this document.

The present invention can be used to pipeline vector logic having a monotonic progression, thereby eliminating any static hazard problems.

Further advantages of the present invention will become apparent to one skilled in the art upon examination of the following drawings and the detailed description. It is intended that any additional advantages be incorporated herein.

BRIEF DESCRIPTION OF THE DRAWINGS

The present invention, as defined in the claims, can be better understood with reference to the text and to the following drawings.

FIG. 9A shows a high level block diagram of a pipeline latch having a vector input and a vector output for the discussion of FIG. 9B;

FIG. 9B shows a state diagram for the pipeline latch of FIG. 9A;

DETAILED DESCRIPTION OF THE PREFERRED EMBODIMENT

Table of Contents

Figure 1:
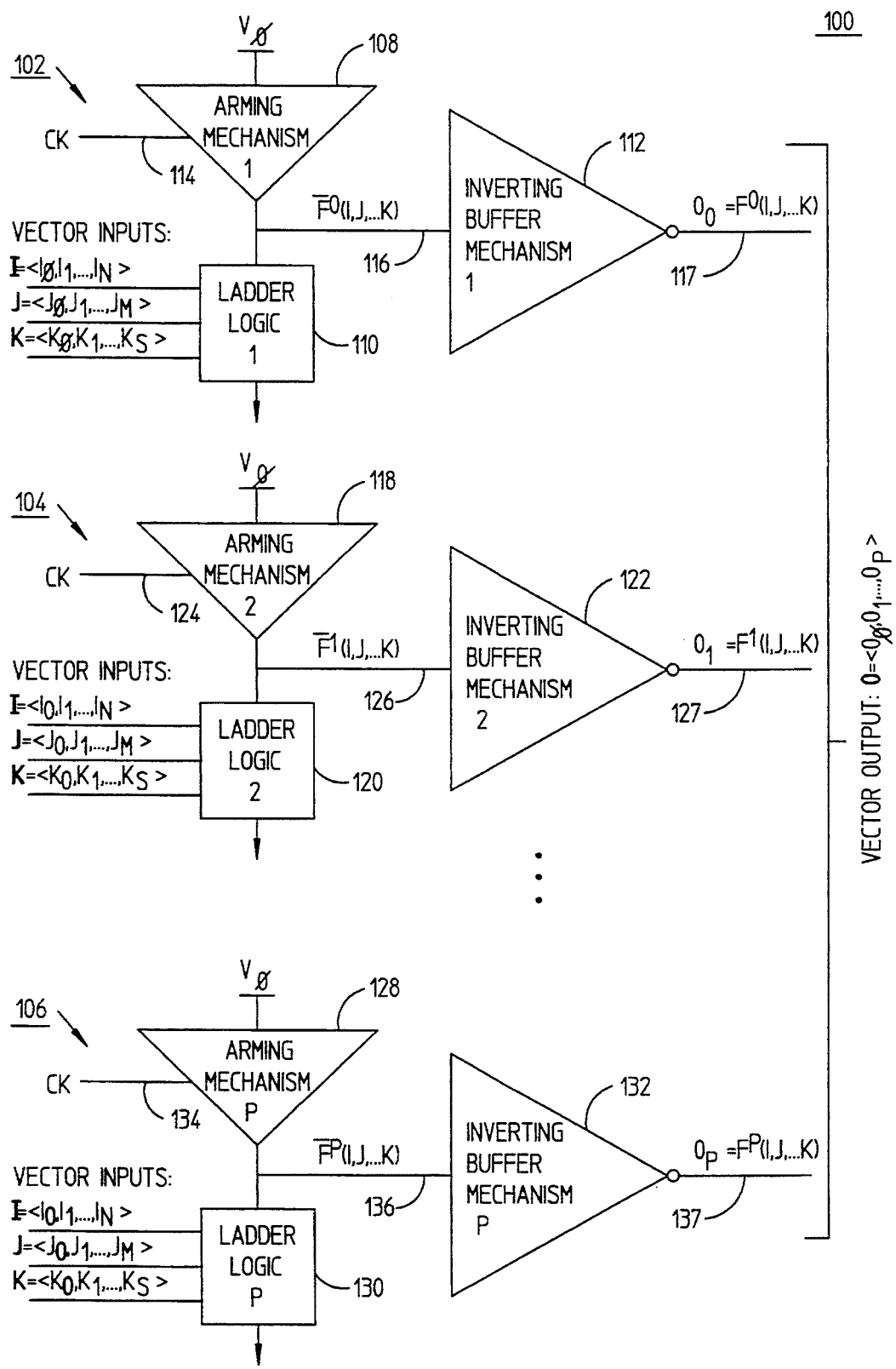
FIG. 1 illustrates a high level block diagram of a family of dynamic logic gates, called "mousetrap" logic gates, which can be pipelined in accordance with the present invention.

I. Logic System
  A. Vector Logic:
  B. Mousetrap Logic Gates
    1. Architecture
    2. Operation
    3. Inclusive OR Gate
    4. Add Predecoder Gate
    5. Carry Propagate Gate
    6. Shared Ladder Logic
    7. Exclusive OR Gates
II. Pipelining
  A. Overview of Pipelines
  B. Pipelining Mousetrap Logic Stages
    1. Architecture
    2. Operation
  C. Latch State Machine
  D. First Embodiment Of Latch
    1. Architecture
    2. Operation
  E. Second Embodiment Of Latch
III. Clocking System of the Present Invention
  A. First Preferred Embodiment
  B. Second Preferred Embodiment
  C. Third Preferred Embodiment I. Logic System Mousetrap logic gates are the subject matter focused upon in copending application Ser. No. 07/684,720 entitled "A FUNCTIONALLY COMPLETE FAMILY OF SELF-TIMED LOGIC CIRCUITS," by Jeffry Yetter, filed Apr. 12, 1991 now U.S. Pat. No. 5,208,490. The present invention is essentially directed to, among other things, the pipelining of logic stages comprised of cascaded self-timed mousetrap logic gates, as presented in detail below. However, before pipelining is discussed, a description of mousetrap gates is warranted.

A. Vector Logic

Typically, logic in a computer is encoded in binary fashion on a single logic path, which is oftentimes merely an electrical wire or semiconductor throughway. By definition, a high signal level, usually a voltage or current, indicates a high logic state (in programmer's language, a "1"). Moreover, a low signal level indicates a low logic state (in programmer's language, a "0").

The present invention envisions implementing "vector logic" by pipelining mousetrap gates. Vector logic is a logic configuration where more than two valid logic states may be propagated through the logic gates in a computer. Unlike conventional binary logic having two valid logic states (high, low) defined by one logic path, the vector logic of the present invention dedicates more than one logic path for each valid logic state and permits an invalid logic state.

For example, in accordance with one embodiment, in a vector logic system requiring two valid logic states, two logic paths are necessary. When both logic paths are at a logic low, i.e., "0,0", an invalid logic state exists by definition. Moreover, a logic high existing exclusively on either of the two logic paths, i.e., "1,0" or "0,1", corresponds with the two valid logic states of the vector logic system. Finally, the scenario when both logic paths are high, i.e., "1,1", is an undefined logic state in the vector logic system.

In a vector logic system requiring three logic states in accordance with another embodiment, three logic paths would be needed, and so on. In conclusion, in accordance with the foregoing embodiment, a vector logic system having n valid logic states and one invalid state comprises n logic paths.

Furthermore, encoding of vector logic states could be handled by defining a valid vector logic state by a logic high on more than one logic path, while still defining an invalid state when all paths exhibit a low logic signal. In other words, the vector logic states are not mutually exclusive.

For example, in a vector logic system using a pair of logic highs to define each valid vector logic state, the following logic scheme could be implemented. With three logic paths, "0,1,1" could designate a vector logic state 1, "1,0,1" a vector logic state 2, and "1,1,0" a vector logic state 3. With four logic paths, six valid vector logic states could be specified. Specifically, "0,0,1,1" could designate a vector logic state 1, "0,1,0,1" a vector logic state 2, "1,0,0,1" a vector logic state 3, "0,1,1,0" could designate a vector logic state 4, "1,0,1,0" a vector logic state 5, and "1,1,0,0" a vector logic state 6. With five logic paths up to ten valid vector logic states could be specified, and so on.

As another example, a vector logic system could be derived in accordance with the present invention wherein three logic highs define each valid vector logic state. In conclusion, as is well known in the art, the above vector schemes can be summarized by a mathematical combination formula. The combination formula is as follows:

$$i = \binom{n}{m} = \frac{n!}{m!(n-m)!}$$

where variable n is the number of logic paths (vector components), variable m is the number of logic paths which define a valid vector logic state (i.e., the number of logic paths which must exhibit a logic high to specify a particular vector logic state), and variable i is the number of possible vector logic states.

B. Mousetrap Logic Gates

FIG. 1 illustrates a high level block diagram of a family of "mousetrap" logic gates in accordance with the present invention. Mousetrap logic gates, described in detail hereinafter, can implement vector logic at high speed, are functionally complete, are self-timed, and do not suffer adverse logic reactions resulting from static hazards when chained in a sequence of stages.

As shown in FIG. 1, each input to the mousetrap logic gate 100 of the present invention is a vector, denoted by vector inputs I, J, ..., K (hereinafter, vectors variables are in bold print). No limit exists as to the number of vector inputs I, J, ..., K. Further, each of vector inputs I, J, ..., K may be specified by any number of vector components, each vector component having a dedicated logic path denoted respectively in FIG. 1 by $I_0$-$I_N$, $J_0$-$J_M$, and $K_0$-$K_S$.

Essentially, each vector input specifies a vector logic state. As mentioned previously, an invalid vector logic state for any of the input vectors I, J, ..., K is present by definition when all of its corresponding vector components, respectively, $I_0$-$I_N$, $J_0$-$J_M$, and $K_0$-$K_S$, are at a logic low.

The output of the generic mousetrap logic gate 100 is also a vector, denoted by a vector output O. The vector output O is comprised of vector components $O_0$-$O_P$. The vector components $O_0$-$O_P$ are mutually exclusive and are independent functions of the vector inputs I, J, ..., K. Further, the vector components $O_0$-$O_P$ have dedicated mousetrap gate components 102-106, respectively, within the mousetrap logic gate 100. By definition in the present invention, one and only one of $O_0$-$O_P$ is at a logic high at a any particular time.

Moreover, no limit exists in regard to the number of vector components $O_0$-$O_P$ which can be associated with the output vector O. The number of vector components $O_0$-$O_P$ and thus mousetrap gate components 102-106 depends upon the logic function to be performed on the vector inputs individually or as a whole, the number of desired vector output components, as well as other considerations with respect to the logical purpose of the mousetrap logic gate 100.

1. Architecture

With reference to FIG. 1, each mousetrap gate component 102-106 of the mousetrap logic gate 100 comprises an arming mechanism 108, ladder logic 110, and an inverting buffer mechanism 112. The arming mechanism 108 is a precharging means, or energizing means, for arming and resetting the mousetrap logic gate 100.

The arming mechanism 108 essentially serves as a switch to thereby selectively impose a voltage $V_0$ defining a logic state on a line 116 upon excitation by a clock signal (high or low) on line 114. As known in the art, any type of switching element or buffer for selectively applying voltage based upon a clock signal can be used. Furthermore, when the logic of a computer system is based upon current levels, rather than voltage levels, then the arming mechanism 108 could be a switchable current source, which is also well known in the art. Any embodiment serving the described switching function as the arming mechanism 108 is intended to be incorporated herein.

The ladder logic 110 is designed to perform a logic function on the vector inputs I, J, ..., K. The ladder logic 110 corresponding to each mousetrap gate component 102-106 may vary depending upon the purpose of each mousetrap gate component 102-106. In the preferred embodiment, the ladder logic 110 is essentially a combination of simple logic gates, for example, logic OR gates and/or logic AND gates, which are connected in series and/or in parallel. It should be noted that the ladder logic 110 is configured in the present invention so that one and only one of the vector output components $O_0$-$O_P$ is at a logic high at any sampling of a valid vector output O. Specific implementations of the ladder logic 110 are described below in regard to the illustrations of FIGS. 2-5.

The ladder logic 110 must operate at high speed because it resides in the critical logic path, unlike the arming mechanism 108 which initially acts by arming the mousetrap gate component, but then sits temporarily dormant while data actually flows through the mousetrap gate component, i.e., through the critical logic path. Furthermore, because the ladder logic 110 resides in the critical logic path which is essentially where the logical intelligence is positioned, a plurality of logic gates are generally required to implement the desired logic functions.

Also residing in the logic path is the inverting buffer mechanism 112. The inverting buffer mechanism 112 primarily serves as an inverter because in order to provide complete logic functionality in the mousetrap gate 100, it is necessary to have an inversion function in the critical logic path. Moreover, the inverting buffer mechanism 112 provides gain to the signal residing on line 114 and provides isolation between other potential stages of mousetrap gate components similar to the mousetrap logic gate components 102-106 of FIG. 1. The inverting buffer mechanism 112 is characterized by a high input impedance and low output impedance. Any buffer embodiment serving the described function as the buffer mechanism 112 is intended to be incorporated herein.

Furthermore, worth noting is that the arming mechanism 108, the ladder logic 110, and the inverting buffer mechanism 112 could in some implementations all reside on a single integrated circuit (IC), for example, an application specific integrated circuit (ASIC) or microprocessor chip.

2. Operation

The operation of the mousetrap logic gate 100 is described below at a high conceptual level in regard to only the mousetrap gate component 102 for simplicity. The narrowing of the present discussion is well grounded, because the various mousetrap gate components 102-106 are essentially redundant with the exception of their corresponding ladder logic functions implemented by ladder logics 110, 120, and 130. Consequently, the following discussion is equally applicable to the remaining mousetrap gate components 104 and 106.

In operation, upon excitation by a clock CK on the line 114, the arming mechanism 108 pulls up, or drives, the output 116 of the ladder logic 110 to a logic high.

Concurrently, the arming mechanism 108 pulls the input at line 114 to the inverting buffer mechanism 112 to a logic high. Consequently, the corresponding vector component $O_0$ on a line 117 is maintained at a logic low, defined in the present invention as an invalid state. In the foregoing initial condition, the mousetrap logic gate 100 can be analogized as a "mousetrap," in the traditional sense of the word, which has been set and which is waiting to be triggered by the vector inputs I, J, . . . , K.

The mousetrap logic gate 100 will remain in the armed predicament with the vector component $O_0$ in the invalid state, until being triggered by the ladder logic 110. The mousetrap logic gate 100 is triggered upon receiving enough valid vector inputs I, J, . . . , K to definitively determine the correct state of the vector component $O_0$ on the line 117. In some designs of the ladder logic 110, not all of the vector inputs will need to be considered in order to produce an output signal on line 116, and hence, on line 117. The number of vector inputs I, J, . . . , K needed to make the definitive determination of the output state and also the timing of the determination is defined by the content and configuration of the simple logic gates within the ladder logic 110.

After the vector component $O_0$ on line 117 is derived, it is passed onto the next stage (not shown) of logic. The mousetrap logic gate component 102 will not perform any further function until being reset, or re-armed, or refreshed, by the arming mechanism 108. In a sense, the timing from mousetrap gate component to mousetrap gate component as well as gate to gate depends upon the encoded data itself. In other words, the mousetrap gate components are "self-timed."

Mousetrap logic gates in accordance with the present invention directly perform inverting and non-inverting functions. Consequently, in contrast to conventional dynamic logic gates, mousetrap logic gates can perform multiplication and addition, which require logic inversions, at extremely high speeds.

Finally, it should be noted that the family of mousetrap logic gates 100 can be connected in electrical series to derive a combinational logic gate which will perform logic functions as a whole. Thus, a mousetrap gate component, comprising an arming mechanism, ladder logic, and an inverting buffer mechanism, can be conceptualized as the smallest subpart of a mousetrap logic gate. Moreover, various mousetrap gate components can be connected in series and/or in parallel to derive a multitude of logic gates.

However, when mousetrap logic gates are chained together in long chains (perhaps, greater than two or three mousetrap gate components in series), precharging of the chains might require an undesirable lengthy amount of time. The reason is that mousetrap gate components will not be able to pull their output low (invalid) until their input is pulled low. The result is that the mousetrap gate components will charge in sequence from the first to the last in the chain, thereby undesirably slowing the precharge of the overall chain. Hence, a way is needed to cause the mousetrap gate components of a chain to precharge in parallel, not in sequence.

Parallel precharging can be accomplished several different ways. A preferred way is to provide a clock triggered n-channel MOSFET to disable the ladder logics 110, 120, and 130 of FIG. 1 during the precharging of the mousetrap gate components. In other words, a push-pull situation is implemented. The arming mechanism of a mousetrap gate component pulls (precharges) the input to the inverting buffer mechanism high, while the inserted n-channel MOSFET pulls the ladder logic low.

It should be noted that the n-channel MOSFET slightly slows the operation of the mousetrap gate component. However, it should be emphasized that the n-channel MOSFET need not be implemented for every mousetrap gate component. It need only be inserted every second or third mousetrap gate component in series. Moreover, in certain logic circuits, such as multiplication, the parallelism of the logic operation may be exploited to reduce the number of requisite n-channel MOSFETs.

The foregoing embodiment for providing parallel precharging has advantages. It requires little additional power dissipation. Moreover, it can, if desired, be uniformly applied to all mousetrap gate components for simplicity.

Another preferred way of providing for parallel precharging of mousetrap gate components chained in series is to periodically insert a mousetrap AND gate in the critical logic path. The mousetrap AND gate is inputted (1) an output vector component from a preceding mousetrap gate component and (2) the precharge clock. The output of the mousetrap AND gate is inputted to the next in series mousetrap gate component.

3. Inclusive OR Gate

Figure 2:
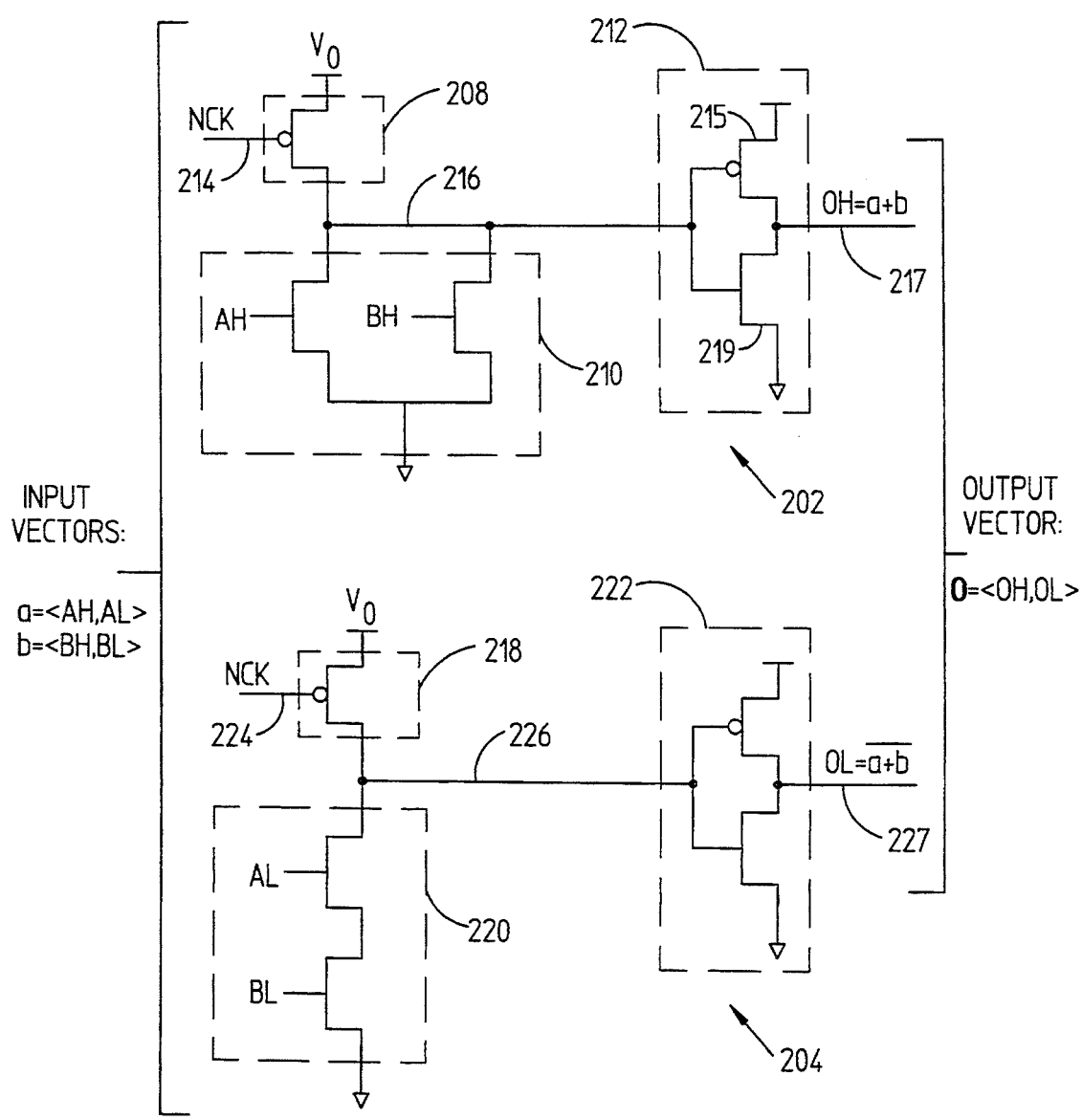
FIG. 2 illustrates a low level block diagram of a two-input inclusive OR mousetrap logic gate in accordance with FIG. 1.

FIG. 2 shows a low level block diagram of an example of a two-input inclusive OR mousetrap logic gate 200 in accordance with the present invention of FIG. 1. The inclusive OR mousetrap logic gate 200 can be used in a vector logic system having two logic states and one invalid logic state.

As shown, the inclusive OR mousetrap logic gate 200 has two mousetrap gate components 202 and 204. The mousetrap gate component 202 comprises an arming mechanism 208, ladder logic 210, and an inverting buffer mechanism 212. The mousetrap gate component 204 comprises an arming mechanism 218, ladder logic 220, and an inverting buffer mechanism 222. Note the similarity of reference numerals with regard to FIG. 1, as well as with the other figures to follow.

The inclusive OR mousetrap logic gate 200 and specifically, the arming mechanisms 208 and 218, is armed by command of a clock NCK ("N" denotes active at logic low) on respective lines 214 and 224. In the preferred embodiments of the present invention, the arming mechanisms 208 and 218 are p-channel metal-oxide-semiconductor field-effect transistors (MOSFET), as shown in FIG. 2, which are well known in the art and are commercially available. N-channel MOSFETs could be used instead of p-channel MOSFETs; however, the clocking obviously would be diametrically opposite.

With reference to FIG. 2, the MOSFETs comprising the arming mechanisms 208 and 218 essentially serve as switches to thereby impose a voltage V0 on respective lines 216 and 226 upon excitation by a low clock NCK signal on respective lines 214 and 224. As further known in the art, any type of switching element for voltage can be used.

Additionally, in the preferred embodiments, the simple logic in the ladder logics 210 and 220 is implemented with n-channel MOSFETs, as shown. The rationale for using n-channel MOSFETs is as follows. N-channel MOSFETs have superior drive capabilities, space requirements, and load specifications, than comparable p-channel MOSFETs. A typical n-channel MOSFET can generally switch approximately fifty percent faster than a comparable p-channel MOSFET having similar specifications.

Furthermore, in the preferred embodiments, the inverting buffer mechanisms 212 and 222 are static CMOSFET inverters, as shown in FIG. 2, which are well known in the art and are commercially available. A CMOSFET inverter is utilized for several reasons. As stated previously, an inversion must take place in the critical logic path in order to provide functional completeness. The inversion which must take place in the critical path can be accomplished by cleverly manipulating the design (gain) of a conventional CMOSFET inverter, which comprises both a p-channel MOSFET pull-up 215 and an n-channel MOSFET pull-down 219. In other words, because of the known existence of a monotonic progression, the ratio of the widths of the MOSFET gates can be designed to favor switching in one direction [i.e., either high (1) to low (0) or low (0) to high(1)], at the expense of the other direction.

Specifically, in the particular CMOSFET inverter envisioned by the present invention, the gate width of the constituent p-channel MOSFET 215 is made wider than the gate width of the constituent n-channel MOSFET 219. Consequently, the CMOSFET inverter output switches very quickly from a logic low (0; the armed state of the mousetrap) to a logic high (1; the unarmed state of the mousetrap). The speed of the CMOSFET inverter output switching from a logic high to a logic low does not matter because the mousetrap gate 200 is precharged during this time period. Hence, the mousetrap logic gate 200 can be constructed to exhibit superior performance and size specifications in one direction, to thereby tremendously increase the speed of data transfer and reduce the size specifications of the mousetrap logic gate 200.

With respect to operation, a truth table for the inclusive OR mousetrap logic gate 200 is set forth in Table A hereinafter.

TABLE A

| a | b | O | AH | AL | BH | BL | OH | OL |
|---|---|---|----|----|----|----|----|----|
| inv | inv | inv | 0 | 0 | 0 | 0 | 0 | 0 |
| inv | 0 | inv | 0 | 0 | 0 | 1 | 0 | 0 |
| 0 | inv | inv | 0 | 1 | 0 | 0 | 0 | 0 |
| 1 | x | 1 | 1 | 0 | x | x | 1 | 0 |
| x | 1 | 1 | x | x | 1 | 0 | 1 | 0 |

In the above Table A, "x" denotes a an irrelevant or "don't care" situation; "inv" denotes an invalid logic state; "1" denotes a high logic state; and "0" denotes a low logic state.

As indicated in Table A and shown in FIG. 2, a vector input a and a vector input b are operated upon by the inclusive OR mousetrap logic gate 200 to derive a vector output O. For discussion purposes, it is worth noting that vector input a, vector input b, and vector output O could correspond respectively with vector input I, vector input J, and vector output O of FIG. 1.

Vector input a specifies a vector logic state defined by two vector components AH and AL. Vector input b specifies a vector logic state defined by two other vector components BH and BL. Vector output O specifies a vector logic state defined by two vector components OH and OL, which collectively describe the inclusive disjunction (OR function) of vector inputs a and b. In vector notation, as shown, a=<AH,AL>; b=<BH,BL>; and O=<OH,OL>=a+b.

4. Add Predecoder Gate

Figure 3:
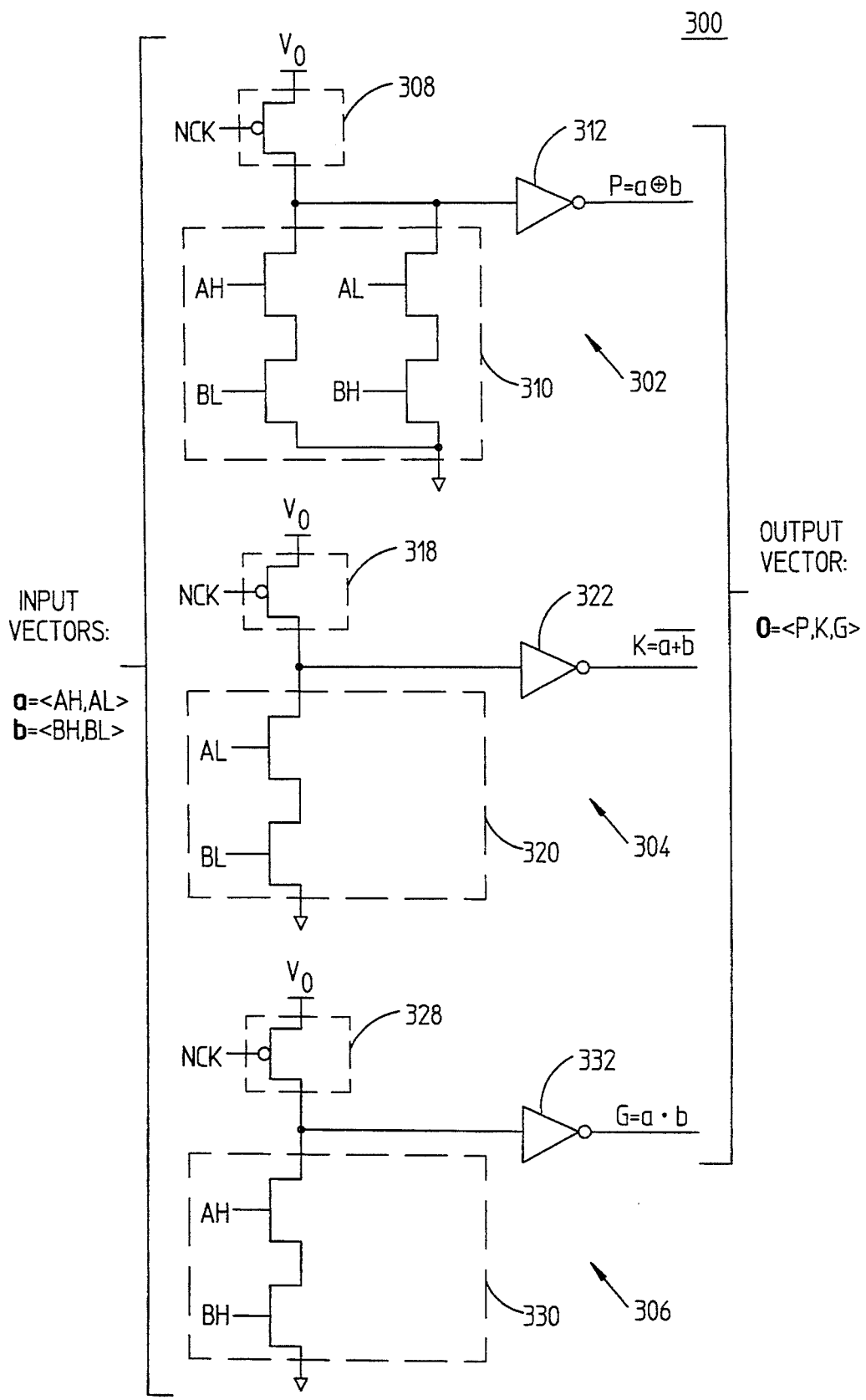
FIG. 3 illustrates a low level block diagram of a two-input add predecoder mousetrap logic gate in accordance with FIG. 1.

FIG. 3 shows a low level block diagram of a two-input add predecoder mousetrap logic gate 300 in accordance with the present invention of FIG. 1. Well known in the art, a predecoder is logic primarily used in the arithmetic logic unit (ALU) to perform arithmetic functions, especially addition. Generally, a predecoder aids in parallel processing and facilitates control of a carry bit path.

As shown, the predecoder 300 has three mousetrap gate components 302–306. Respectively, the three mousetrap gates 302–306 comprise the following: (1) an arming mechanism 308, ladder logic 310, and a buffer 312; (2) an arming mechanism 318, ladder logic 320, and a buffer 322; and (3) an arming mechanism 328, ladder logic 330, and a buffer 332.

A truth table describing the operation of the add predecoder logic gate 300 is set forth in Table B hereinafter.

TABLE B

| a | b | O | AH | AL | BH | BL | P | K | G |
|---|---|---|----|----|----|----|---|---|---|
| inv | x | inv | 0 | 0 | x | x | 0 | 0 | 0 |
| x | inv | inv | x | x | 0 | 0 | 0 | 0 | 0 |
| 0 | 0 | kill | 0 | 1 | 0 | 1 | 0 | 1 | 0 |
| 0 | 1 | prop | 0 | 1 | 1 | 0 | 1 | 0 | 0 |
| 1 | 0 | prop | 1 | 0 | 0 | 1 | 1 | 0 | 0 |
| 1 | 1 | gen | 1 | 0 | 1 | 0 | 0 | 0 | 1 |

Similar to the inclusive OR mousetrap logic gate 200 of FIG. 2, vector input a specifies a vector logic state defined by two vector components AH and AL. Vector input b specifies a vector logic state defined by two other vector components BH and BL. However, in contrast to the mousetrap logic gate of FIG. 2, vector output O specifies a vector logic state defined by three vector components P, K, and G, discussed in detail below. In vector notation, as shown, a=<AH,AL>; b=<BH,BL>; and O=<P,K,G>.

Conventional predecoders are usually designed so that the output indicates only one of two logic states. In many implementations, the conventional predecoder indicates either that the carry should be "propagated" (designated by "P") or that the carry bit should be "killed" (designated by "K"). In other implementations, the predecoder indicates either that the carry should be "propagated" or that the carry bit should be "generated" (designated by "G"), In the present invention, as noted in Table B, the vector output O can indicate any of four logic states: an invalid state and three valid states, namely, kill, propagate, or generate.

Furthermore, the add predecoder logic gate 300 must perform an exclusive OR function as part of the overall predecoder function. Conventionally, dynamic logic gates could not implement the exclusive OR function because static hazards would cause logic errors. Static hazards occur in combinational logic configurations because of propagation delays. The mousetrap logic gates of the present invention are not adversely affected by static hazards, because of self-timing. No valid vector component output is present unless all the vector inputs, needed to definitively determine the output of the ladder logic, are valid as indicated in Table B.

5. Carry Propagate Gate

Figure 4:
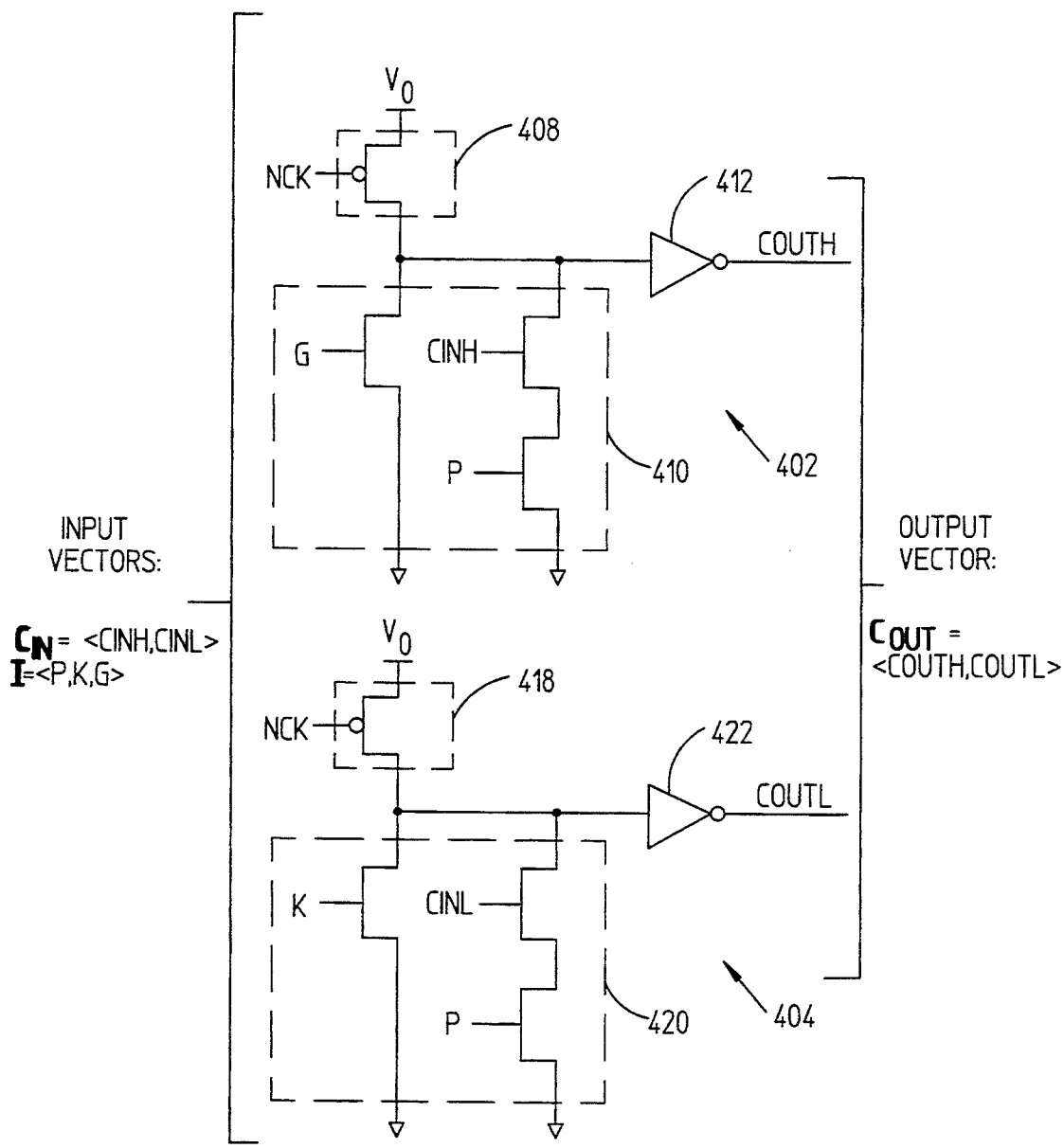
FIG. 4 illustrates a low level block diagram of a carry propagate mousetrap logic gate in accordance with FIG. 1 and for use series with the add predecoder mousetrap logic gate of FIG. 3.

FIG. 4 shows a low level block diagram of a carry propagate gate 400 in accordance with the present invention. Well known in the art, a carry propagate logic gate is oftentimes used in series with an add predecoder logic gate, as discussed previously, in order to control a carry bit path in an ALU. Specifically, the carry propagate gate 400 functions in series with the add predecoder logic gate 300 in the preferred embodiment to provide a high performance carry bit path.

The carry propagate gate 400 has two mousetrap gate components 402 and 404. The mousetrap gate component 402 comprises an arming mechanism 408, ladder logic 410, and an inverting buffer mechanism 412. The mousetrap gate component 404 comprises an arming mechanism 418, ladder logic 420, and an inverting buffer mechanism 422.

To further clarify the functionality of the carry propagate gate 400, a truth table for the carry propagate gate 400 is set forth in Table C hereinafter.

known in the art. They are especially useful in adder and multiplier logic circuits.

The exclusive OR logic gate 500 has two mousetrap gate components, having respective arming mechanisms 538 and 548 as well as inverting buffer mechanisms 532 and 542. However, as shown by a phantom block 550, the ladder logic associated with each of the two mousetrap gate components is not separated completely in hardware, but remains mutually exclusive in a logic sense. Hence, as a general proposition, because the ladder logic in each mousetrap gate component of a mousetrap logic gate uses the same type of gates, namely, n-channel MOSFETs, sometimes their logic functions can share the same hardware, thereby resulting in a less number of total gates and a reduction in utilized computer real estate.

A truth table indicating the operation of the exclusive OR logic gate 500B is set forth in Table D hereinafter.

TABLE C

| I | CIN | COUT | P | K | G | CINH | CINL | COUTH | COUTL |
|---|---|---|---|---|---|---|---|---|---|
| inv | x | inv | 0 | 0 | 0 | x | x | 0 | 0 |
| x | inv | inv | x | x | x | 0 | 0 | 0 | 0 |
| kill | x | 0 | 0 | 1 | 0 | x | x | 0 | 1 |
| prop | 0 | 0 | 1 | 0 | 0 | 0 | 1 | 0 | 1 |
| prop | 1 | 1 | 1 | 0 | 0 | 1 | 0 | 1 | 0 |
| gen | x | 1 | 0 | 0 | 1 | x | x | 1 | 0 |

TABLE D

| a | b | c | s | AH | AL | BH | BL | CH | CL | SH | SL |
|---|---|---|---|---|---|---|---|---|---|---|---|
| inv | x | x | inv | 0 | 0 | x | x | x | x | 0 | 0 |
| x | inv | x | inv | x | x | 0 | 0 | x | x | 0 | 0 |
| x | x | inv | inv | x | x | x | x | 0 | 0 | 0 | 0 |
| 0 | 0 | 0 | 0 | 0 | 1 | 0 | 1 | 0 | 1 | 0 | 1 |
| 0 | 0 | 1 | 1 | 0 | 1 | 0 | 1 | 1 | 0 | 1 | 0 |
| 0 | 1 | 0 | 1 | 0 | 1 | 1 | 0 | 0 | 1 | 1 | 0 |
| 0 | 1 | 1 | 0 | 0 | 1 | 1 | 0 | 1 | 0 | 0 | 1 |
| 1 | 0 | 0 | 1 | 1 | 0 | 0 | 1 | 0 | 1 | 1 | 0 |
| 1 | 0 | 1 | 0 | 1 | 0 | 0 | 1 | 1 | 0 | 0 | 1 |
| 1 | 1 | 0 | 0 | 1 | 0 | 1 | 0 | 0 | 1 | 0 | 1 |
| 1 | 1 | 1 | 1 | 1 | 0 | 1 | 0 | 1 | 0 | 1 | 0 |

6. Shared Ladder Logic

Figure 5A:
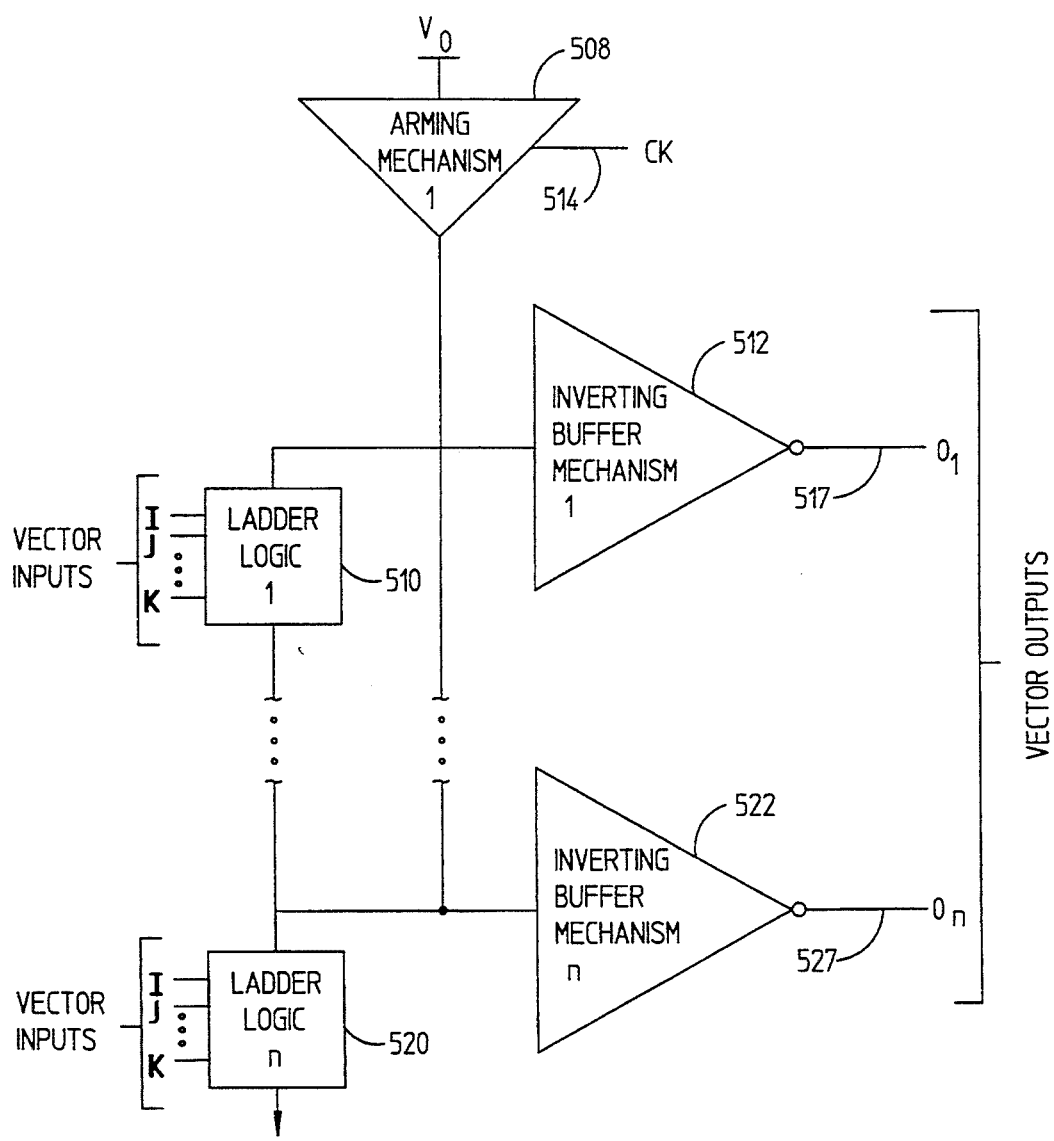
FIG. 5A illustrates a high level block diagram of a mousetrap logic gate having shared ladder logics.

FIG. 5A shows a high level block diagram of an embodiment of a mousetrap logic gate wherein the ladder logics 510–520 of any number n of mousetrap gate components have been combined in a single mousetrap logic gate 500A. The mousetrap logic gate 500A is inputted with a plurality of vectors I, J, ..., K, and/or parts thereof. In turn, the gate 500A outputs a plurality of vector output components $<O_1-O_n>$, which can define vectors and/or partial vectors.

Essentially, the logic function which generated the vector component output $<O_n>$ is a subset of all logic functions deriving vector component outputs $<O_1>$ through $<O_{n-1}>$. More specifically, the vector component output $<O_1>$ is determined by ladder logics 510, 520, while the vector component output $<O_n>$ is determined by only ladder logic 520. As is obvious from FIG. 5A, this configuration saves hardware and cost. More outputs are derived with less ladder logic.

7. Exclusive OR Gates

Figure 5B:
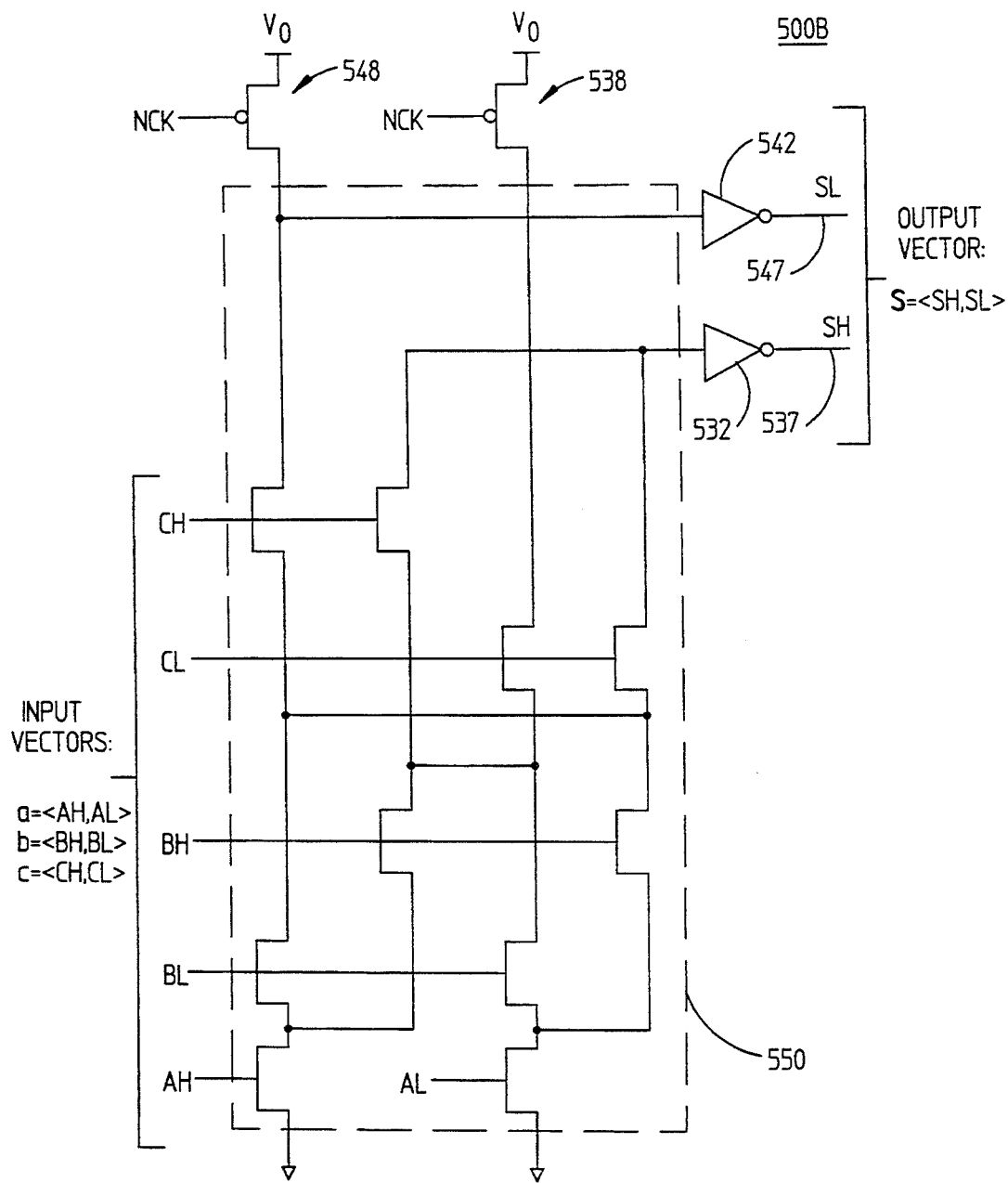
FIG. 5B illustrates a low level block diagram of a three-input exclusive OR mousetrap logic gate in accordance with FIG. 5A.

A specific example of FIG. 5A is illustrated in FIG. 5B. FIG. 5B shows a low level block diagram of a three-input exclusive-OR (XOR) mousetrap logic gate 500B. The exclusive OR mousetrap logic gate 500B can be used for high speed sum generation in either a full or half adder and does not suffer from any adverse effects from static hazards. Sum generation logic gates are well As indicated in Table D and shown in FIG. 5B, vector input a specifies a vector logic state defined by two vector components AH and AL. Vector input b specifies a vector logic state defined by two other vector components BH and BL. Vector input c specifies a vector logic state defined by two vector components CH and CL. Furthermore, vector output s specifies a vector logic state defined by two outputs SH and SL. In vector notation, as shown, a=$<AH,AL>$; b=$<BH,BL>$; c=$<CH,CL>$; and s=$<SH,SL>$.

Figure 5C:
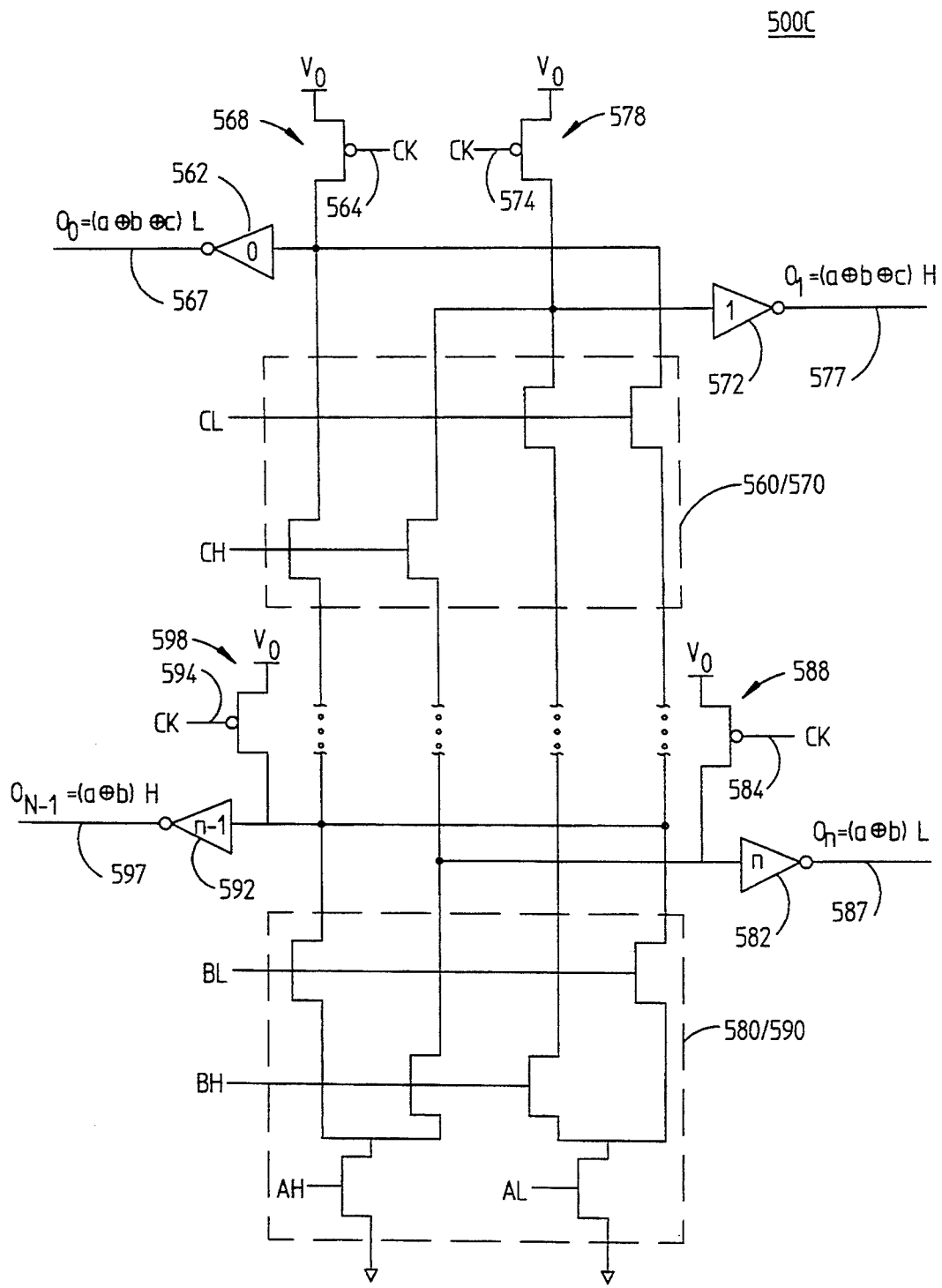
FIG. 5C illustrates a low level block diagram of a combined two-input/three-input exclusive OR mousetrap logic gate in accordance with FIG. 5A.

Another specific example of FIG. 5A is illustrated in FIG. 5C. FIG. 5C shows a low level block diagram of a three-input exclusive-OR (XOR) logic gate combined with a two-input exclusive-OR (XOR) logic gate. The input vectors are a=$<AH, AL>$, b=$<BH, BL>$, and c=$<CH, CL>$. Furthermore, the output vectors are the XOR logic function of vectors a and b, defined by vector component outputs $<O_0, O_1>$, as well as the XOR logic function of vectors a, b, and c, defined by vector component outputs $<O_{n-1}, O_n>$. The vector component outputs $<O_0, O_1>$ are determined by ladder logics 560–590, while the vector component outputs $<O_{n-1}, O_n>$ are determined by only ladder logics 580, 590. Worth noting is that FIG. 5C illustrates a mousetrap logic gate having multiple vector inputs and multiple vector outputs.

II. Pipelining

A. Overview of Pipelines

The pipelining of logic stages comprised of static logic gates is well known in the art. "Static" logic gates are traditional logic gates which do not require a periodic precharge to maintain a proper logic state. In general, "pipelining" refers to the process of commencing a new operation prior to the completion of an outstanding, or in-progress, operation for the purpose of increasing the rate of data processing and throughput.

Figure 6:
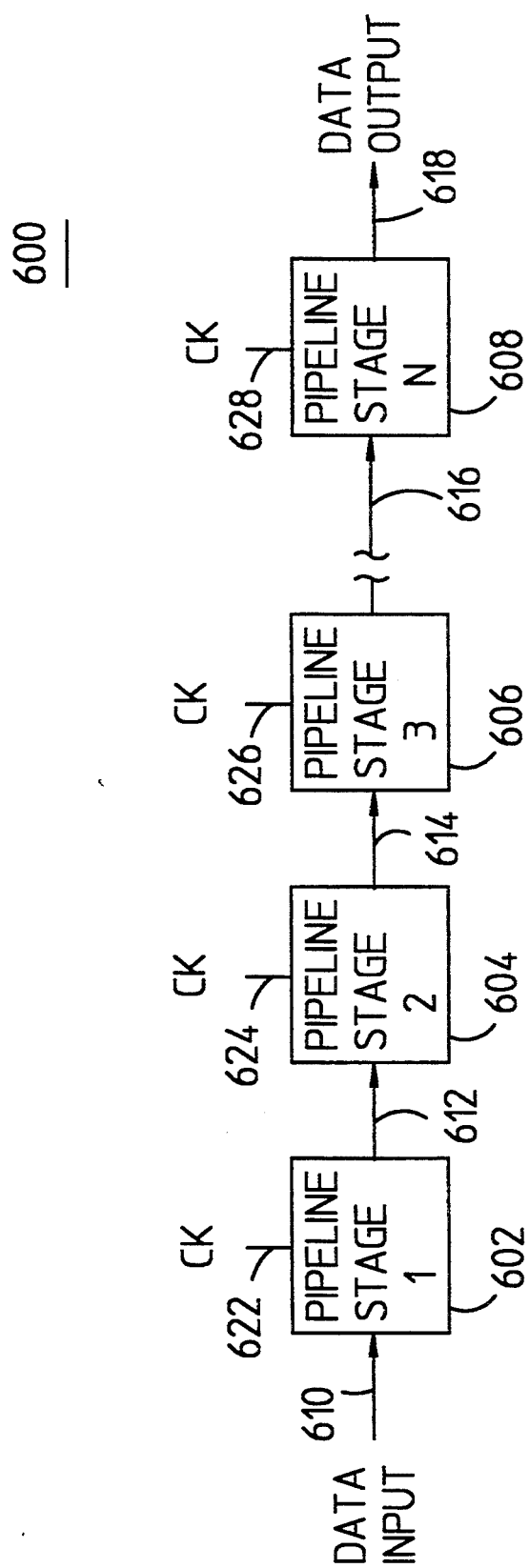
FIG. 6 illustrates a high level block diagram of a sequence of pipeline stages forming a pipeline.

FIG. 6 illustrates a conventional pipeline (or section of a pipeline) 600 of N pipeline stages 602–608 in sequence. Each of the pipeline stages 602–608 comprises any number of stages of logic gates. Data is introduced into the pipeline 600 as indicated by an arrow 610. The data ultimately travels through and is independently processed by each of the pipeline stages 602–608 of the sequence, as shown by successive arrows 612–618.

Data is clocked through the pipeline 600 via clocks 622–628, which could be identical or staggered in phase as desired. Usually, successive pipeline stages are uniformly triggered by the same clock edge (either rising or falling) and are clocked a full cycle (360 degrees) out of phase.

With respect to FIG. 6, pipelining means that new data is clocked into the pipeline 600, as indicated by the arrow 610, while old data is still remaining in the pipeline 600 being processed. Pipelining increases the useful bandwidth of high latency logic networks.

Pipelining is often implemented to perform arithmetic operations, including floating point operations. For example, to perform multiplication, a "carry save adder" pipeline of logic stages is usually employed. Specifically, each pipeline stage is essentially several rows of conventional full adder logic stages. Moreover, each full adder compresses three partial products into two partial products. Thus, each full adder adds in another partial product as data flows through the chain of full adder logic stages in each pipeline stage. In order to perform a single multiplication operation, more than one clock cycle is usually required, but as a result of pipelining, a new multiplication operation may be commenced generally in substantially less than, perhaps in half of, the total number of clock cycles.

The pipelining of dynamic logic gates, particularly mousetrap logic gates shown in FIG. 1, poses peculiar problems, unlike in the pipelining of static logic gates. With reference to FIG. 1, mousetrap logic gates 100 require a precharge cycle in order to arm the mousetrap gate components 102–106, rendering them potentially operative. Effectively, a precharge cycle periodically interrupts the useful work cycle for the necessary purpose of maintenance. Precharge cycles significantly and undesirably decrease the useful bandwidth of a sequence of mousetrap pipeline stages.

Moreover, if attempts are made to use both clock edges (rising and falling), as envisioned by the present invention, in order to hide the precharge during the "off duty" clock time of a pipeline stage (when the pipeline stage is not propagating data), then the mousetrap logic gates are adversely affected by a phenomenon known as "clock asymmetry." This concept is discussed in detail with respect to FIG. 7 below.

Figure 7:
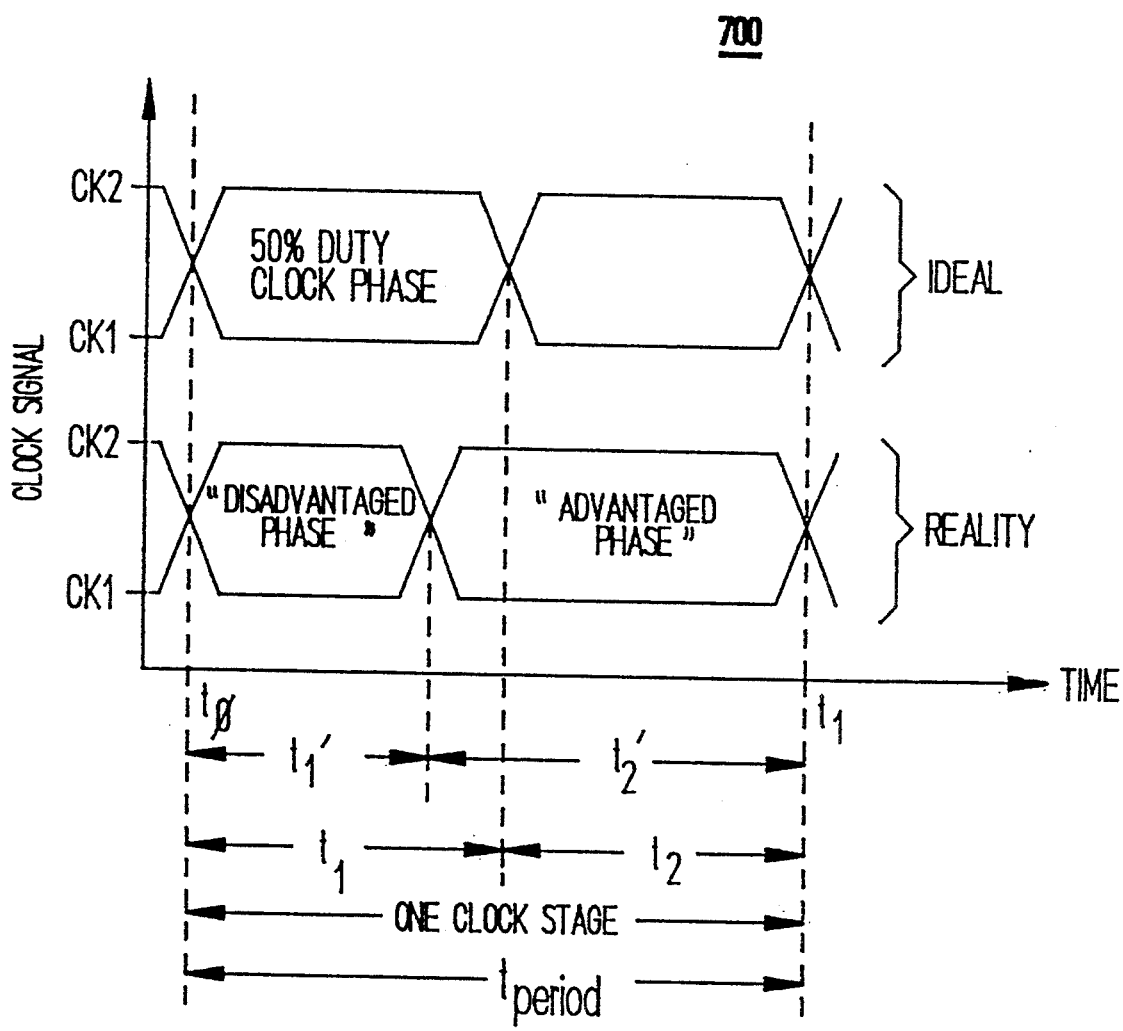
FIG. 7 illustrates graphically the relationship and the inherent clock asymmetry between the two clocks in the preferred embodiments wherein advantaged and disadvantaged clock phases arise.

FIG. 7 graphically illustrates a possible two clock system which may be employed with the pipeline 600 of FIG. 6. In the hypothetical scenario, the odd numbered logic stages of the N logic stages 602–608 are clocked by a clock CK1. Moreover, the even numbered logic stages are clocked by a clock CK2. The two clock system is desirable in order to hide the precharge delay from the forward logic path, as envisioned by the present invention.

As shown in FIG. 7, clocks CK1 and CK2 are intended by design to switch simultaneously, to be ideally alternating (180 degrees out of phase), and to have a 50 percent duty cycle with respect to one clock state ($t_{period}$) of the computer system's clock. However, because of unavoidable clock asymmetry, an "advantaged phase" ($t_1'$) and a "disadvantaged phase" ($t_2'$) will arise in reality, as comparatively shown in FIG. 7.

Generally, clock asymmetry results from inherent physical inequities in the manufacture of clock generation circuits. The condition results when the pipeline stages 602–608 of FIG. 6 are alternately clocked and with each, by design, having a fifty percent duty cycle. A precise time allocation (duty cycle) to the individual pipeline stages 602–608 of FIG. 6 can never be achieved. A precise allocation or clocking of time to insure that each pipeline stage 602–608 of the pipeline 600 has an identical duty cycle is important because it tremendously affects the useful bandwidth of the pipeline 600.

The pipeline 600 will function with the two clock system of FIG. 7, but the cycle time for the pipeline 600 will be limited by the period of the disadvantaged phase. In other words, the speed of pipeline 600 is less than optimal because valuable time is wasted in the pipeline stages (either even or odd) operating in the advantaged phase. More time is accorded to the pipeline stages corresponding with the advantaged phase than is necessary for complete operation of the pipeline stages. Worth noting is that the clock asymmetry cannot be compensated for by balancing delays in the pipeline stages because the direction of the time deviation cannot be known.

If pipeline 600 used pipeline stages 602–608 having static logic gates, such as conventional edge-triggered latch paradigm systems, clock asymmetry is not a problem because only one of the clock edges, i.e., either the rising or falling clock edge, is utilized for clocking each pipeline stage. The problem is solved because the time period separating two parallel clock edges can be precisely controlled with simple and inexpensive conventional circuitry.

However, in regard to dynamic logic gates, such as mousetrap logic gates 100 as shown in FIG. 1, the foregoing solution is not desirable because optimally both clock edges should perform a purpose (either precharge or propagation) in order to achieve high performance by hiding the precharging operation from the forward logic path.

B. Pipelining Mousetrap Logic Stages

1. Architecture

The pipelining of self-timed mousetrap logic stages is subject matter focused upon in parent application serial no. , entitled "UNIVERSAL PIPELINE LATCH FOR MOUSETRAP LOGIC CIRCUITS" filed Apr. 12, 1991. The present invention is essentially directed to, among other things, optimizing the feed of energizing clock signals to the pipeline of mousetrap logic stages so as to facilitate self-timing, as presented in detail further below. However, before the present invention is discussed, a description of pipelining mousetrap logic stages is set forth below.

Figure 8:
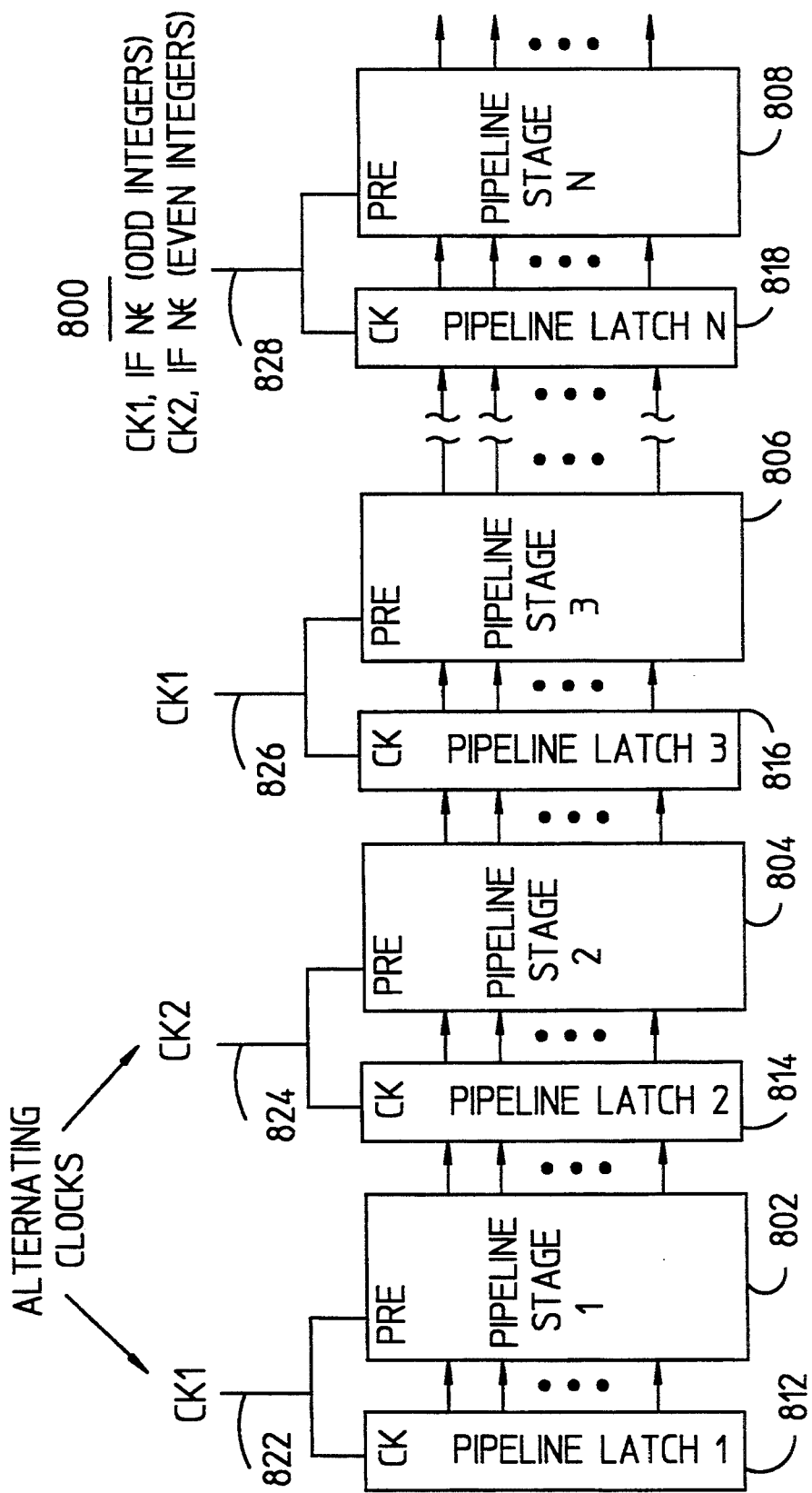
FIG. 8 illustrates a high level block diagram of a pipeline of mousetrap pipeline stages in accordance with the present invention.

FIG. 8 illustrates a high level block diagram of a pipeline 800 of N mousetrap pipeline stages 802–808.

Each of the mousetrap pipeline stages 802–808 comprises one or more mousetrap logic gates, as shown in FIG. 1, connected in series and/or in parallel. As further shown in FIG. 8, N pipeline latches 812–818 are associated in correspondence with the N mousetrap pipeline stages 802–808.

Furthermore, in the preferred embodiments, an alternating two clock system is implemented as previously discussed in regard to FIG. 7 in order to hide the precharge of the mousetrap logic gates in the mousetrap pipeline stages 802–808. The rising edge of a clock pulse from a clock CK actuates the input vectors to a pipeline stage, which comprises one or more already-armed mousetrap gates, and the falling edge of the same clock CK precharges the arming mechanisms of the same one or more mousetrap gates for the next vector inputs.

2. Operation

The operation of the pipeline 800 proceeds as follows. During the high time of clock CK1, a valid vector input is driven to the pipeline stage 802 by the pipeline latch 812 (latch 1). Moreover, pipeline stage 802 (stage 1) produces a valid vector output. The foregoing actions occur at all odd numbered stages during the high time of the clock CK1.

Furthermore, during the high time of clock CK1, the clock CK2 is low. Consequently, the vector input to pipeline stage 804 (stage 2) is driven invalid by the pipeline latch 814 (latch 2), which is driven, or enabled, by the high time of clock CK2. Moreover, the pipeline stage 804 (stage 2) produces an invalid vector output because the pipeline stage 804 (stage 2) is forced to armed predicament by the clock CK2 at low time. See FIG. 2 where NCK (active low) operates arming mechanisms 208 and 218. The foregoing actions occur at all even numbered stages during the high time of clock CK1, i.e., during the low time of clock CK2.

Next, the clocks CK1 and CK2 flip-flop, or reverse states. The clock CK2 transcends high, while the clock CK1 transcends low. The leading edge of the clock CK2 actuates the pipeline latch 814 (latch 2). Accordingly, the vector input to pipeline stage 804 (stage 2) is driven valid by the pipeline latch 804 (latch 2). Moreover, the pipeline stage 804 (stage 2) produces a valid vector output. The foregoing actions occur at all even numbered pipeline stages during the high time of clock CK2.

Furthermore, during the high time of the clock CK2, the clock CK1 is low. As a result, the vector input to pipeline stage 802 (stage 1) is driven invalid by pipeline latch 812 (latch 1), which is driven by the clock CK1 at high time. The pipeline stage 802 (stage 1) produces an invalid vector output because the pipeline stage 802 (stage 1) is forced in an armed predicament by the low clock CK1. The foregoing actions occur at all even numbered stages during the high time of clock CK2.

As a result of the above described operation parameters, one operation cycle starts and another finishes during each clock state ($CK_{machine} = CK1 + CK2$) of the computer system. The precharge latency for the even numbered stages coincides with the logic propagation delay in the odd numbered stages, and vice versa. Thus, the overall delay incurred for precharging is hidden.

Another significant aspect of the pipeline 800 illustrated in FIG. 8 is that it provides for insensitivity to clock asymmetry. The pipeline stages (odd or even numbered) which operate in the disadvantaged phase effectively "steal" time from pipeline stages (even or odd numbered, respectively) which operate in the advantaged phase. The ability to steal time is available in part as a result of the inherent characteristics of mousetrap logic gates and in part as a result of the unique design and methodology of the pipeline latches 812–818.

Specifically, during the low time of a clock when precharging takes place at a particular pipeline stage, the vector outputs of the particular pipeline stage are forced to the invalid state. Moreover, during the high time of the clock, the vector inputs of the particular pipeline stage are forced to the valid state by enablement of the corresponding pipeline latch. Optimally, the vector inputs transition to a valid state and travel through the corresponding latch before the clock falls. Then, the vector inputs are processed by the pipeline stage and are gated to the stage's output when the clock falls.

However, if the clock falls before the transition of vector inputs to the valid state and subsequent transmission of the valid vector inputs to the stage, then the pipeline latch at the input of the pipeline stage behaves as an "data-triggered" latch for the duration of the clock low time. In other words, a late arriving valid input state will be transferred immediately to the pipeline stage and processed by the pipeline stage. The pipeline stage's vector output is derived and persists at the output until the next transition to clock high time.

As a specific example to illustrate how time is stolen from the advantaged phase, consider the hypothetical proposition that pipeline stage 804 (stage 2) is initially active (propagation) and operates in the disadvantaged phase. The pipeline stage 804 (stage 2) can produce its result after the disadvantaged phase has already passed, or lapsed, due to the precharged predicament of its mousetrap logic gates. Specifically, the precharging of mousetrap logic gates is slow compared to the forward logic delay. Thus, the one or more mousetrap logic gates in the pipeline stage 804 can produce a valid vector output even after the precharge cycle is relinquished.

Further, because all of the vector inputs to pipeline latch 816 (latch 3) are self-timed, the pipeline latch 816 (latch 3) is designed to capture the vector output of stage 804 (stage 2) well after the disadvantaged phase of stage 804 (stage 2), i.e., during the advantaged stage of stage 806 (stage 3). The vector output will be driven into the pipeline stage 806 (stage 3) slightly late in time, but proper functioning will occur because the pipeline stage 806 (stage 3) has time to waste being that it is operating in the advantage phase. Hence, pipeline stage 806 (stage 3) has in effect stolen time to pay the deficit in pipeline stage 804 (stage 2). Moreover, the pipeline 800 will operate as if the two clocks CK1 and CK2 had a perfect 50 percent duty cycle ($t_1 = t_2$), as shown graphically in the upper portion of FIG. 7.

C. Latch State Machine

Figure 9A:
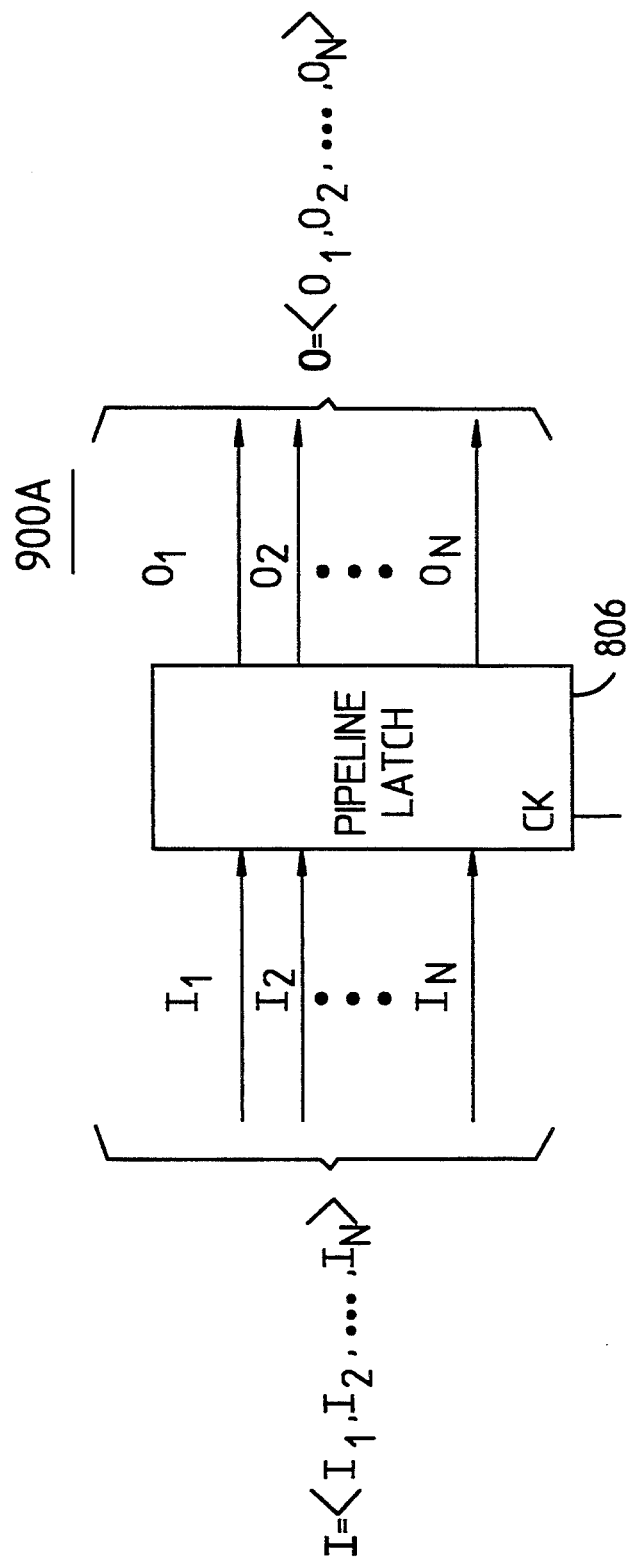
FIGS. 9A and 9B collectively illustrate at a high level the envisioned operation and response of the various pipeline latches of FIG. 8, in accordance with the present invention.
Figure 9B:
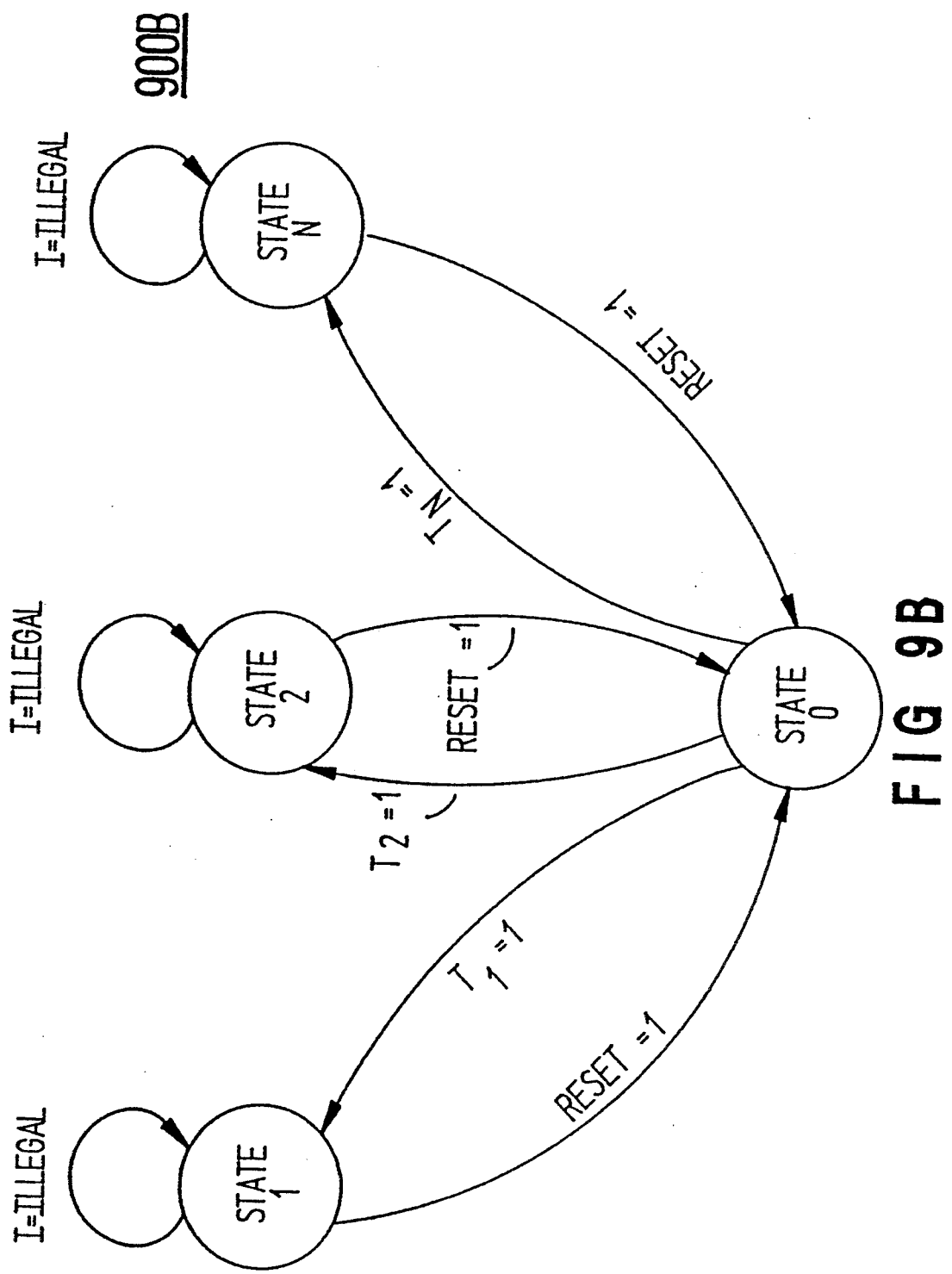

The pipeline latches 812–818 can be implemented as state machines operating in accord with a state diagram 900B of FIG. 9B. For proper understanding of the state diagram 900B, FIG. 9A shows a high level block diagram of a pipeline latch 900A having a vector input $I = <I_1, I_2, \ldots, I_N>$ and a vector output $O = <O_1, O_2, \ldots, O_N>$, which corresponds to the pipeline latch 900A of FIG. 9A.

By designing the pipeline latch 900A to operate consistent with the state diagram 900B, logic operations can be performed by the novel pipeline 800 without a requisite minimum clock frequency.

Mousetrap logic gates which are pipelined in the conventional fashion, such as in FIG. 6, must maintain a minimum clock frequency in order to insure proper functioning. Proper operation of individual mousetrap gates requires that an electrical charge be deposited and maintained on the associated buffer mechanisms (reference numerals 112, 122, and 132 of FIG. 1) to maintain a proper logic states.

In reality, the electrical charge deposited on the buffer mechanisms eventually will discharge due to an unknown logic level and thereby corrupt the state of the pipeline. The decay results from uncontrollable design characteristics. Accordingly, vector outputs of mousetrap logic gates decay to an invalid logic state, defined as the case when more than one vector component is high. In most practical situations, the preceding problem may be overcome via a periodic refresh cycle, similar to the refresh cycle in conventional DRAM. Hence, a minimum clock rate, analogous to refresh cycles, must be maintained.

The minimum clock rate poses an additional problem. Many times, logic gates are required to operate arbitrarily slow, for instance, during IC testing. Conventionally, dynamic logic gates can be modified to exhibit slow operation by including "trickle charge" devices or "cross-coupled negative feedback" devices. However, these devices consume valuable computer real estate and further decrease the speed of the logic gates.

In order to eliminate the need for the pipeline 800 to operate at a minimum clock rate, the pipeline latches 812–818 are implemented as state machines operating in accord with the state diagram 900B of FIG. 9B.

In the state diagram 900B of FIG. 9B, "RESET" is defined, for purposes of discussion, as follows: RESET=CK*INVALID I=CK*<$I_1, I_2, \ldots, I_n=0$>. Furthermore, the states of the state machine 900B are defined as indicated in the state table, Table E, set forth below.

TABLE E

| States of Output | State Machine Status of Vector | Status of Vector Components |
|---|---|---|
| 0 | invalid | all = 0 |
| 1 | valid | $O_1$ = 1, all others = 0 |
| 2 | valid | $O_2$ = 1, all others = 0 |
| N | valid | $O_N$ = 1, all others = 0 |

D. First Embodiment of Latch

Figure 10:
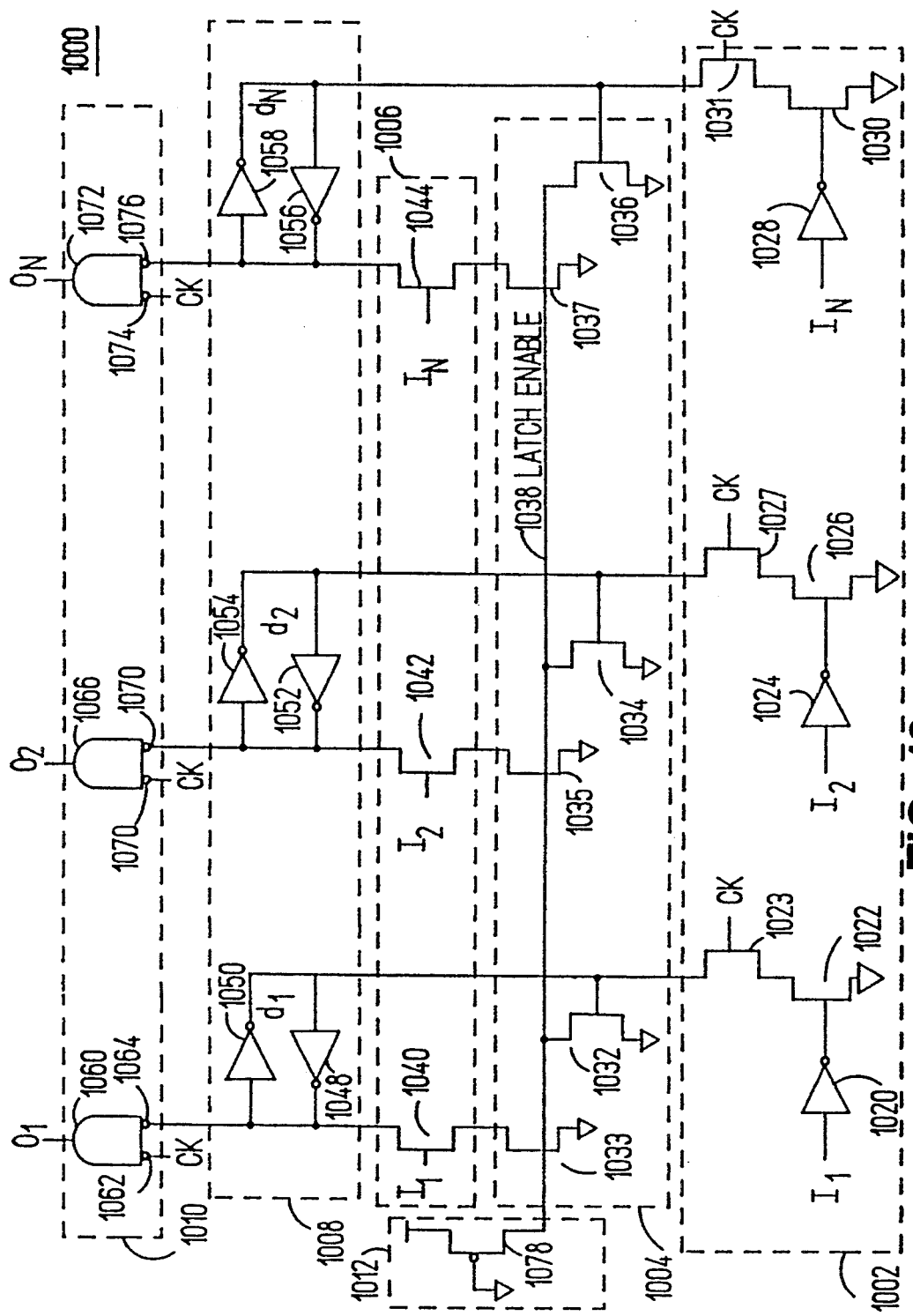
FIG. 10 illustrates a low level block diagram of a first embodiment of the mousetrap pipeline latch in FIG. 8.

FIG. 10 illustrates a low level block diagram of an exemplary mousetrap pipeline latch 1000, corresponding with any one of the mousetrap pipeline latches 812–818 in FIG. 8. The latch 1000 is a first embodiment. For discussion purposes, only a single vector input I and a single vector output O are shown and described, but the discussion is equally applicable to any number of vector inputs and outputs.

1. Architecture

As shown in FIG. 10, the latch 1000 of the first embodiment comprises a latch reset mechanism 1002, an input trigger disabling mechanism 1004, an input trigger mechanism 1006, a flip-flop mechanism 1008, an output gating mechanism 1010, and a latch enable pull-up mechanism 1012.

More specifically, as shown in FIG. 10, the latch reset mechanism 1002 comprises a combination of a CMOSFET inverter and a MOSFET for each of the vector components $I_1$–$I_N$ of a vector input I. A CMOSFET inverter 1020 and an n-channel MOSFET 1022 correspond with an input vector component $I_1$. A CMOSFET inverter 1024 and an n-channel MOSFET 1026 correspond with an input vector component $I_2$. Finally, a CMOSFET inverter 1028 and an n-channel MOSFET 1030 correspond with an input vector component $I_N$. The inverse of each of the foregoing input vector components $I_1$–$I_N$ is derived by the corresponding inverter and the result is used to switch the respective MOSFET.

The input trigger disabling mechanism 1004 comprises n-channel MOSFETs 1032–1037. A dual set of MOSFETs is allocated to each of the N input vector components $I_1$–$I_N$. The MOSFETs 1032–1037 serve to pull a latch enable 1038 low as needed during operation which is discussed in specific detail later.

The input trigger mechanism 1006 has n-channel MOSFETs 1040–1044, one MOSFET for each of the N input vector components $I_1$–$I_N$. The MOSFETs are 1040–1044 are actuated by the N input vector components and serve to trigger the pipeline latch 1000.

The flip-flop mechanism 1008 comprises dual sets of conventional inverters, configured as shown. The pair of inverters 1048 and 1050 correspond with the input vector component $I_1$. The pair of inverters 1052 and 1054 correspond with the input vector component $I_2$. Finally, the pair of inverters 1056 and 1058 correspond with the input vector component $I_N$.

The output gating mechanism 1010 comprises N AND gates corresponding to the N vector components of a vector output O. As shown, the AND gates have inverted inputs. An AND gate 1060 with inverters 1062 and 1064 is associated with the output vector component $O_1$. An AND gate 1066 with inverters 1068 and 1070 is associated with the output vector component $O_2$. Finally, an AND gate 1072 with inverters 1074 and 1076 is associated with the output vector component $O_N$.

The latch enable pull-up mechanism 1012 comprises a p-channel MOSFET 1078 which pulls the latch enable 1038 to a logic high when necessary. The specific operation of the pipeline latch 1000 is described below. The operation is in accordance with Table E, set forth previously.

2. Operation

The following sequence of events, or cycle, is applicable to the pipeline latch 1000 when the vector input I turns valid from invalid during the high time of clock CK. More generally, the following sequence of events will occur in the latch 1000 when the latch 1000 drives the input to a pipeline stage operating in the disadvantaged phase or when the pipeline 800 is operating very slow (at DC). In other words, the vector inputs to the latch 1000 are produced by a preceding pipeline stage operating in the advantaged phase.

Clock High Time (a) The latch enable 1038 is initially low. Moreover, by the design of the circuitry, note that $d_1+d_2+\ldots+d_n$=not(latch enable)=1.

(b) The vector output O is forced invalid (all vector components low; $O_1$−$O_N$=O) by the output gating mechanism 1010 via the AND gates 1060, 1066, and 1072 with the high clock signal (either CK1 or CK2, depending upon the position of the latch in the pipeline).

(c) The vector input I is invalid (all vector components low; $I_1$−$I_N$=0), as a result of the invalid vector output from the previous pipeline stage caused by precharging.

(d) The flip-flop mechanism 1008 is set, via the latch reset mechanism 1002, such that $d_1-d_N=0$, because of the invalid input vector components $I_1-I_N=0$. Consequently, all pull-down MOSFETs 1032, 1034, and 1036 on the latch enable 1038 of the input trigger mechanism disabling mechanism 1004 are turned off. As a result, the latch enable 1038 gets pulled high by the latch enable pull-up mechanism 1012. Worth noting is that latch enable=-not($d_1+d_2+\ldots+d_n$)=1.

(e) The latch 1000 will remain in this steady state, until the vector input I transitions valid (one of vector components $I_1-I_N$ goes high). The high vector component actuates a MOSFET (1040, 1042, or 1044) of the input trigger mechanism 1006. As a result, a low signal appears at the input of the respective flip-flop, despite the fact that the latched flip-flop value (one of $d_1-d_N$) is attempting to impose a high signal at the input. In other words, the series connection of MOSFETs (1033, 1040; 1035, 1042; 1037, 1044) which is pulling low, wins over the flip-flop pulling high.

(f) As a result of step (e), the respective one of $d_1-d_N$ is turned high. Hence, the high vector component is recognized and is "latched" (preserved) at the respective flip-flop as one and only one of $d_1-d_N$. Moreover, the latch enable 1038 is pulled low through the corresponding pull-down MOSFET (1032, 1034, or 1038), thereby disabling the input trigger mechanism 1006.

(g) At this point, the clock can be stopped without losing the state of the vector input I. The vector input I has been recognized as valid and is preserved. Moreover, input trigger mechanism 1006 is disabled (latch enable=O). Importantly, if an illegal state on the input vector I occurs, i.e, if another vector component goes high, as a result of node decay or some other reason, the pipeline latch 1000 will ignore the illegal state.

(h) Finally, the clock CK transitions low.

Clock Low Time (i) The vector output O is gated valid. In other words, the flip-flop with the latched, high vector component will transmit the high signal to the respective AND gate. All other AND gates will not emit an output signal.

(j) The vector input I turns to the invalid state as a result of the forced invalid output setting of the previous stage due to precharging. The latch reset mechanism 1002 remains disabled and latch enable 1038 is low.

(k) The clock transitions high and the foregoing cycle is repeated.

The following sequence of events is applicable to the pipeline latch 1000 when the vector input turns valid from invalid after a clock high time. More generally, the following sequence of events will occur in the latch 1000 when the latch 1000 drives the input to a mousetrap pipeline stage operating in the advantaged phase, i.e., when the latch 1000 is receiving inputs from a pipeline stage operating in the disadvantaged phase.

Clock High Time (a) The latch enable 1038 is initially low. Moreover, by the design of the circuitry, note that $d_1+d_2+\ldots+d_n$=not(latch enable)=1.

(b) The vector output O is forced invalid (all vector components low; $O_1-O_N=0$) by the output gating mechanism 1010 via the AND gates 1060, 1066, and 1072 with the high clock signal (either CK1 or CK2, depending upon the position of the latch in the pipeline).

(c) The vector input I is invalid (all vector components low; $I_1-I_N=0$), as a result of the invalid vector output from the previous pipeline stage caused by precharging.

(d) The flip-flop mechanism 1008 is reset, via the latch reset mechanism 1002, such that $d_1-d_N=0$, because of the invalid input vector components $I_1-I_N$. Consequently, all pull-down MOSFETs 1032, 1034, and 1036 on the latch enable 1038 of the input trigger mechanism disabling mechanism 1004 are turned off. As a result, the latch enable 1038 gets pulled high by the latch enable pull-up mechanism 1012. Worth noting is that latch enable=-not($d_1+d_1+\ldots+d_n$)=1.

(e) The clock transitions low.

Clock Low Time (f) The vector output O is gated out of the latch 1000. Because no valid input has yet been received, $d1-dN=0$ and the vector output O remains invalid (all vector components are low).

(g) The vector input I transitions valid (one of the vector component goes high). The high vector component actuates the corresponding MOSFET of the input trigger mechanism 1006. Consequently, the high vector component is recognized and passes through the corresponding MOSFET and directly through the corresponding AND gate. Said another way, the vector output O transitions to a valid state. In a sense, the latch 1000 operates after its allotted clock time as a "transparent" latch. It steals time from the subsequent stage in the pipeline.

(h) In turn, the flip-flop mechanism 1008 pulls the latch enable 1038 low through the corresponding pull-down MOSFET (1032, 1034, or 1036), thereby disabling the input trigger mechanism 1006.

(i) The vector input turns to the invalid state as a result of the forced invalid output setting of the previous stage due to precharging. The vector output remains valid (latched). Moreover, the latch reset mechanism 1002 remains disabled and latch enable 1038 remains low.

(j) The clock transitions high and the foregoing cycle is repeated.

It should be noted that the output gating mechanism 1010 of the foregoing first latch embodiment may be redundant with clock gating structures in the following pipeline stage (which were implemented to facilitate parallel precharge as discussed earlier). If this is true, the output gating mechanism 1010 can be eliminated from the latch proper without any change in system behavior.

E. Second Embodiment of Latch

Figure 11:
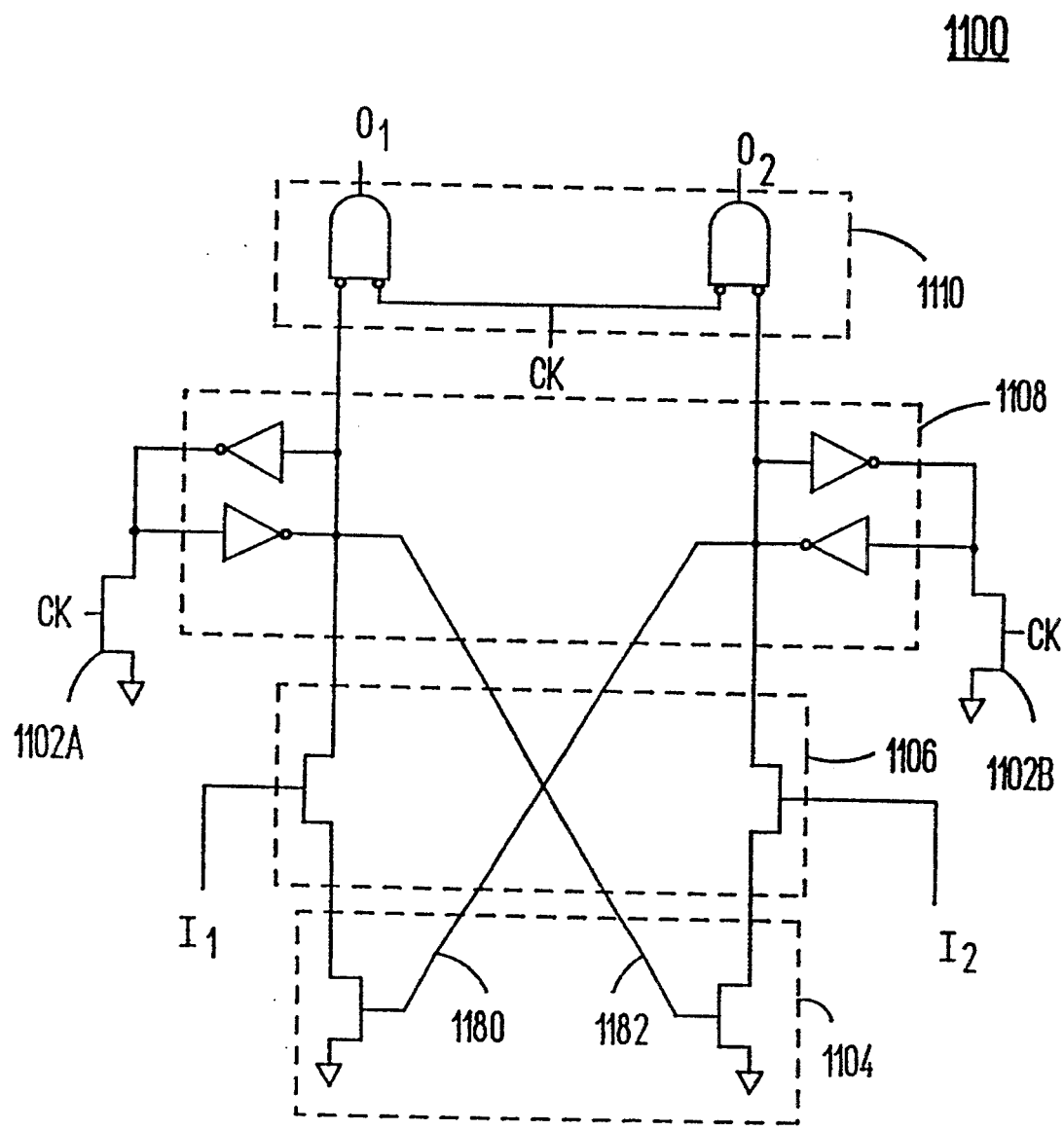
FIG. 11 illustrates a low level block diagram of the mousetrap latch in accordance with a second embodiment wherein the pipeline of FIG. 8 processes a vector input and a vector output, each having only two vector components.

FIG. 11 illustrates a low level block diagram of a useful mousetrap pipeline latch 1100 when the pipeline latch 1000 of FIG. 10 has a vector input I and a vector output O having only two vector components (N=2).

As shown, the latch 1100 comprises a latch reset mechanisms 1102A and 1102B, an input trigger disabling mechanism 1104, an input trigger mechanism 1106, a flip-flop mechanism 1108, and an output gating mechanism 1110.

Several aspects of the latch 1100 are worth noting. A cross-over network, denoted by reference numerals 1180 and 1182, has been implemented. As a consequence, no latch enable pull-up mechanism 1012 as in FIG. 10 is needed. Moreover, the inverters 1020, 1024, and 1028 shown in the latch reset mechanism 1002 of FIG. 10 are not required and have been eliminated, thereby further reducing the size and complexity of the circuit.

In operation, at a high conceptual level, the latch 1100 functions in accordance with the methodology set forth in regard to latch 1000 of FIG. 10 to perform the same purpose.

Again, as stated with respect to the first latch embodiment, it should be noted that the output gating mechanism 1110 of the second latch embodiment may be redundant with clock gating structures in the following pipeline stage (which were implemented to facilitate sec-parallel precharge as discussed earlier). If this is true, the output gating mechanism 1110 can be eliminated from the latch proper without any change in system behavior.

III. Clocking System of the Present Invention

A. First Preferred Embodiment

Figure 12:
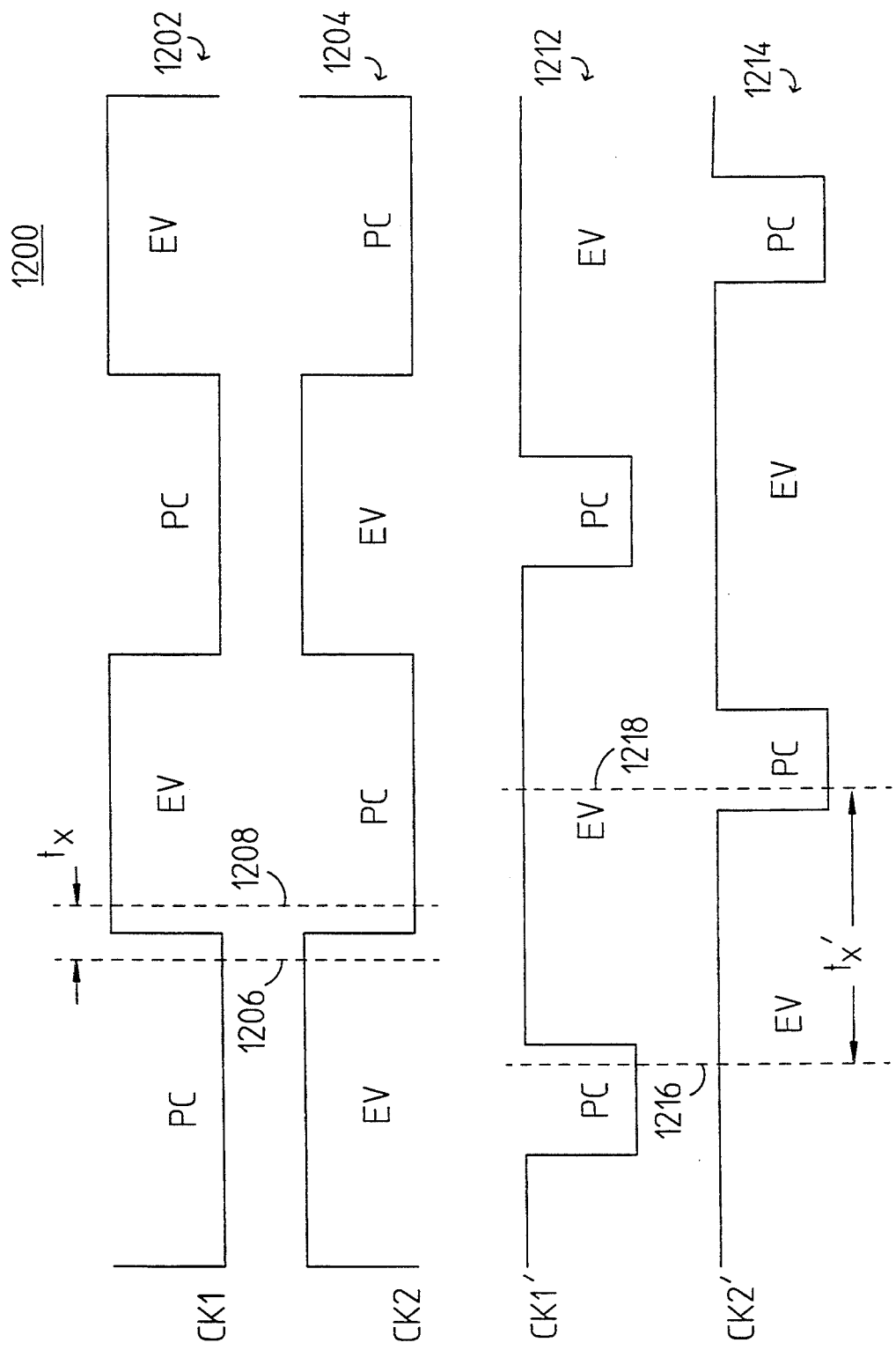
FIG. 12 shows a timing diagram corresponding to the first embodiment of the present invention.

FIG. 12 shows a first preferred embodiment of a clocking system and method in accordance with the present invention. As previously discussed, the clocks CK1 and CK2, which are indicated in FIG. 12 at respective reference numerals 1202 and 1204, are each directed to an exclusive set of alternate pipeline stages. Moreover, the clocks CK1 and CK2 can exhibit a 50% duty cycle. In other words, half of each clock cycle is dedicated to precharging (PC) the corresponding set of alternate pipeline stages (even or odd numbered set), while the other half of the cycle is dedicated to permitting self-timed logic evaluation in the corresponding set of alternate pipeline stages.

However, because of inherent clock asymmetry, the leading and falling edges of clocks CK1 and CK2 can vary by a deviation time $t_x$, as illustrated in FIG. 12 by phantom lines 1206, 1208. In other words, a set of alternate pipeline stages will operate in a "disadvantaged phase" having a shortened (<50%) precharge and logic evaluation period, while the correlative set of pipeline stages 802-808 will operate in an "advantaged phase" having a lengthened (>50%) precharge and logic evaluation period. To overcome the clock asymmetry problem, the N pipeline latches 812-818 permit the pipeline stages 802-808 operating in the disadvantaged phase to steal time from the pipeline stages 802-808 operating in the advantaged phase. Thus, data can flow from one pipeline stage to another anytime during the time window defined by the deviation time $t_x$.

The N latches 812-818 further permit very slow, or "DC", operation of the pipeline 800 by preserving valid vector logic states. In essence, the latches 812-818 look at and preserve their inputs before or during their corresponding clock edges.

In accordance with the first preferred embodiment of the present invention, the clocks CK1 and CK2 are adjusted so that the precharging period (PC) for each pipeline stage 802-808 is substantially less than the evaluation period (EV), as indicated by clocks CK1', CK2' denoted by respective reference numerals 1212, 1214 in FIG. 12. As a result of the novel timing scheme, the deviation time $t_x$, indicating the window of time in which data can flow from one pipeline stage to another, has been greatly expanded, as indicated by phantom lines 1216, 1218 enclosing $t_x'$. In essence, the evaluation periods corresponding to each of the clocks CK1' and CK2' are overlapping. As a further result of the novel clocking scheme, the N pipeline stages 802-808 may be designed to exhibit varying evaluation times. In other words, the N pipeline stages 802-808 may have varying numbers of self-timed dynamic logic gates.

The novel clocking scheme illustrated in FIG. 12 may be implemented in many ways, as is well known in the art.

B. Second Preferred Embodiment

A second preferred embodiment of the present invention will now be described and illustrated in regard to FIGS. 13-15. In effect, the clocking scheme of the second preferred embodiment ultimately results in the clocking outcome associated with the first preferred embodiment of FIG. 12, but provides for greater flexibility, efficiency, and ease of implementation. The second preferred embodiment is desirable over the first preferred embodiment because the same timing effect for the critical logic path is achieved, but the mousetrap logic gates are accorded a 50% duty cycle for precharging. Essentially, the second preferred embodiment involves dividing the mousetrap (MT) logic gates within each pipeline stage 802-808 into two successive groups, and then clocking each group by a different clock.

Figure 13:
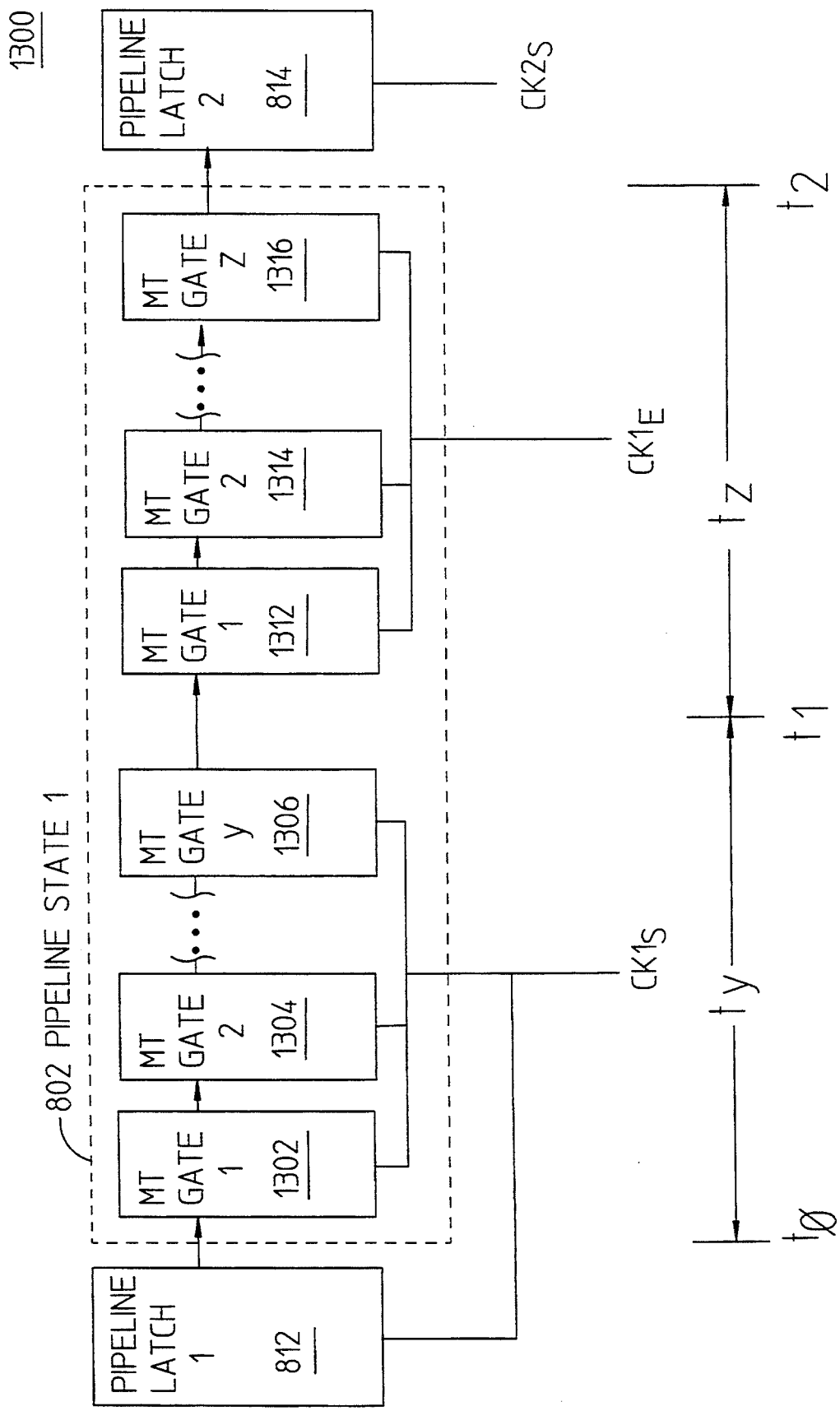
FIG. 13 illustrates a high level block diagram of the second preferred embodiment of the present invention wherein the self-timed dynamic logic gates in a pipeline stage are divided into two groups which are clocked separately.

More specifically, consider FIG. 13. As shown in FIG. 13, for instance, the pipeline stage 802 can comprise any number n of cascaded mousetrap logic gates 1302-1316. In accordance with the second preferred embodiment, these mousetrap logic gates 1302-1316 are divided into two groups, one group comprising any number y of mousetrap logic gates 1302-1306 and another group comprising any number z of mousetrap logic gates 1312-1316, where $y+z=n$. Further, a start clock $CK1_S$ is connected to the pipeline latch 812 and the y mousetrap logic gates 1302-1306, while an end clock $CK1_E$ is connected to the z mousetrap logic gates 1312-1316.

Figure 14:
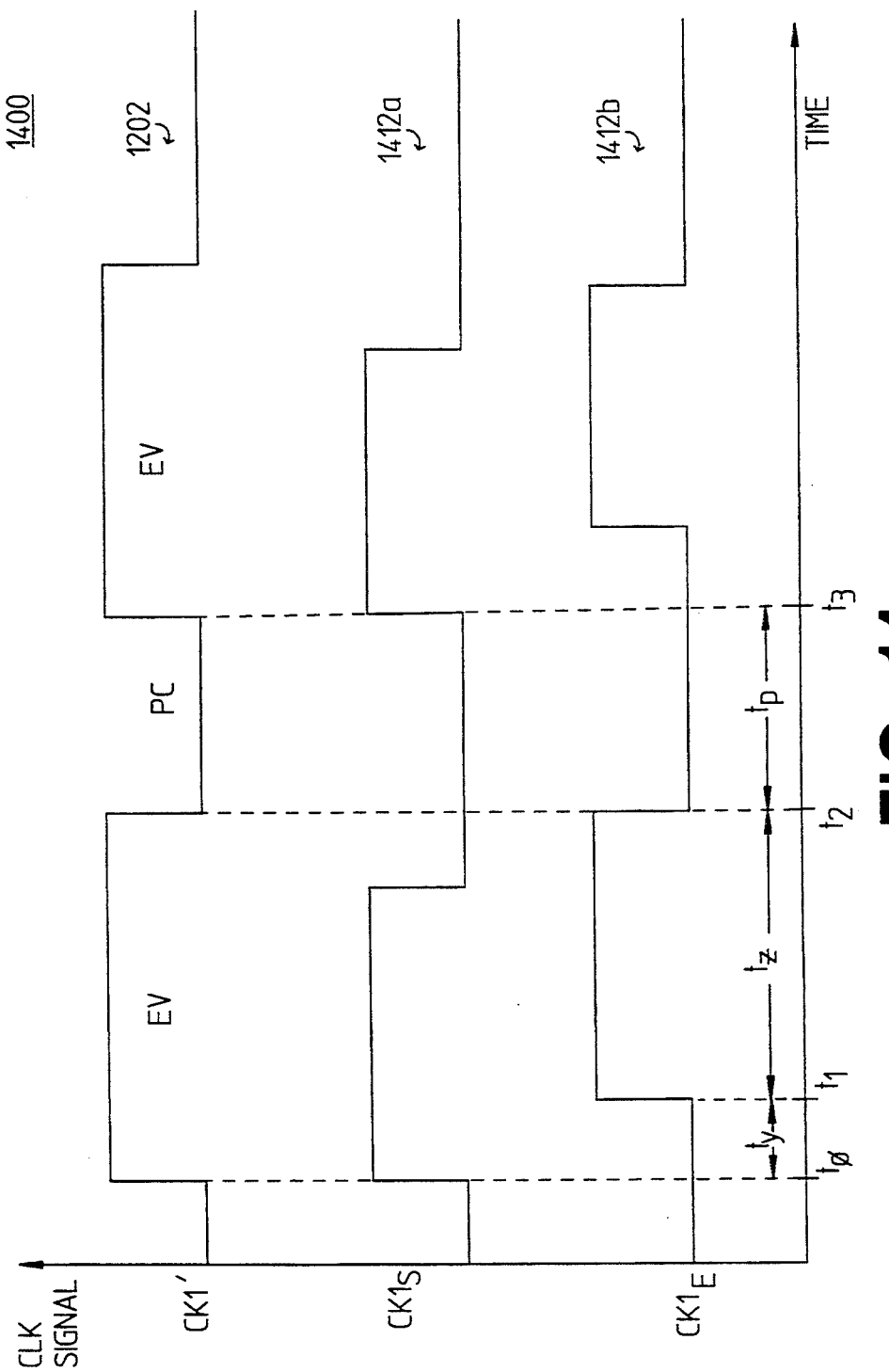
FIG. 14 shows a timing diagram corresponding to the clocks of the second preferred embodiment.

The clocking scheme for clocks $CK1_S$ and $CK1_E$ is shown in FIG. 14. The start clock $CK1_S$ is preferably synchronized with the system clock (not shown). The end clock $CK1_E$ is slightly out of phase with the start clock $CK1_S$ by a selectable predetermined time $t_y$. Said another way, the rising edge of the end clock $CK1_E$ lags in time from the rising edge of the start clock $CK1_S$ by the time $t_y$.

In operation, the start clock $CK1_S$ initiates the logic evaluation period of the pipeline stage 802. As a result, self-timed logic evaluations will commence in the pipeline stage 802. After a time $t_1$, the self-timed logic evaluation has progressed entirely through the y mousetrap logic gates 1302-1306, as shown in FIG. 13. At this point, the end clock $CK1_E$ should have already initiated the logic evaluation period allocated to the z mousetrap logic gates 1312-1316. As a result, the logic evaluations will commence through the z mousetrap logic gates 1312-1316 within a time $t_z$, at which point the vector output will be latched into the pipeline latch 814. Next, the pipeline stage 802 is precharged for a time $t_p$ in preparation for the next logic evaluation period, as indicated in FIG. 14. In conclusion, as a result of the second preferred embodiment, each of the n mousetrap logic gates 1302-1316 is accorded a 50% duty cycle for precharge; however, the critical logic path is accorded a long evaluation period and short precharge period in each pipeline stage 802-808.

In accordance with another significant aspect of the second preferred embodiment, the n mousetrap logic gates 1302-1316 are configured such that the number y of mousetrap logic gates 1302-1306 is much less than the number z of mousetrap logic gates 1312–1316. In a specific implementation of a multiplier, y=2 and z=11. As a result of the foregoing configuration, only about 20% of the mousetrap logic gates load the system clock, from which start clock $CK1_S$ is synchronized. This predicament substantially eases the burden on the system clock and permits an inexpensive implementation of the present invention by allowing the start clock $CK1_S$ to be a fast clock, while the end clock $CK1_E$ can be an inexpensive slow clock.

Figure 15:
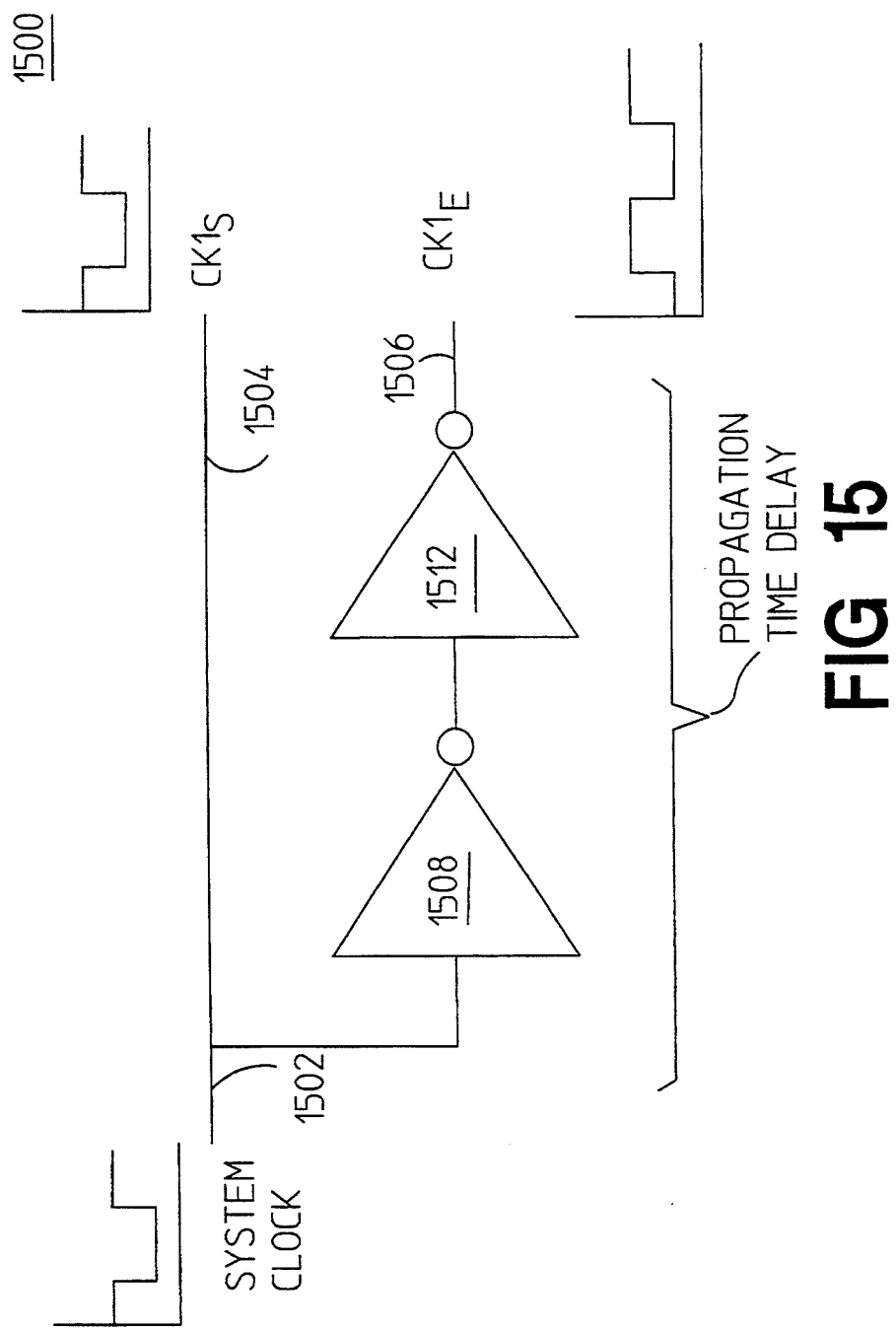
FIG. 15 illustrates a low level block diagram of the architecture for the second preferred embodiment.

A circuit for implementing the two clock clocking scheme of the second preferred embodiment is illustrated in FIG. 15. Referring to FIG. 15, the system clock 1502 is used to directly derive the start clock $CK1_S$ 1504. Furthermore, the end clock $CK1_E$, denoted by reference numeral 1506, is derived from the system clock 1502 by implementing a propagation time delay. The propagation time delay is preferably implemented via a series of cascaded inverters 1508, 1512, which may be of the CMOSFET type. Two inverters 1508, 1512 are utilized so as to maintain the same polarity between the end clock $CK1_E$ and the start clock $CK1_S$. Obviously, any number of inverters 1508, 1512 could be implemented to derive any desired propagation time delay. An even number of inverters 1508, 1512 will produce a time-delayed system clock waveform having the same polarity as the system clock 1502, while an odd number of inverters 1508, 1512 will produce a time-delayed system clock waveform having the opposite polarity of the system clock 1502.

Figure 16:
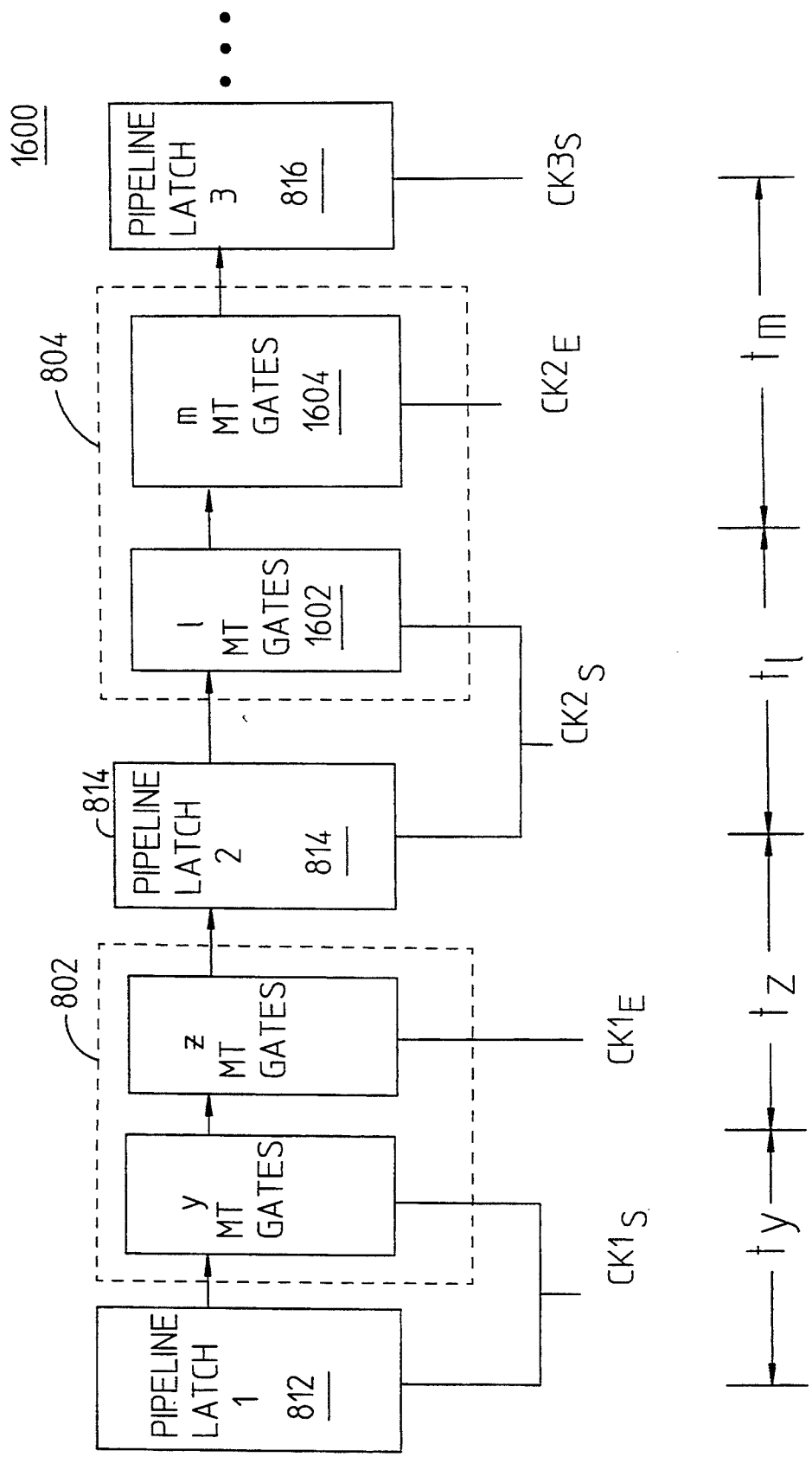
FIG. 16 illustrates a high level block diagram of the division of several pipeline stages in accordance with the second preferred embodiment.
Figure 17:
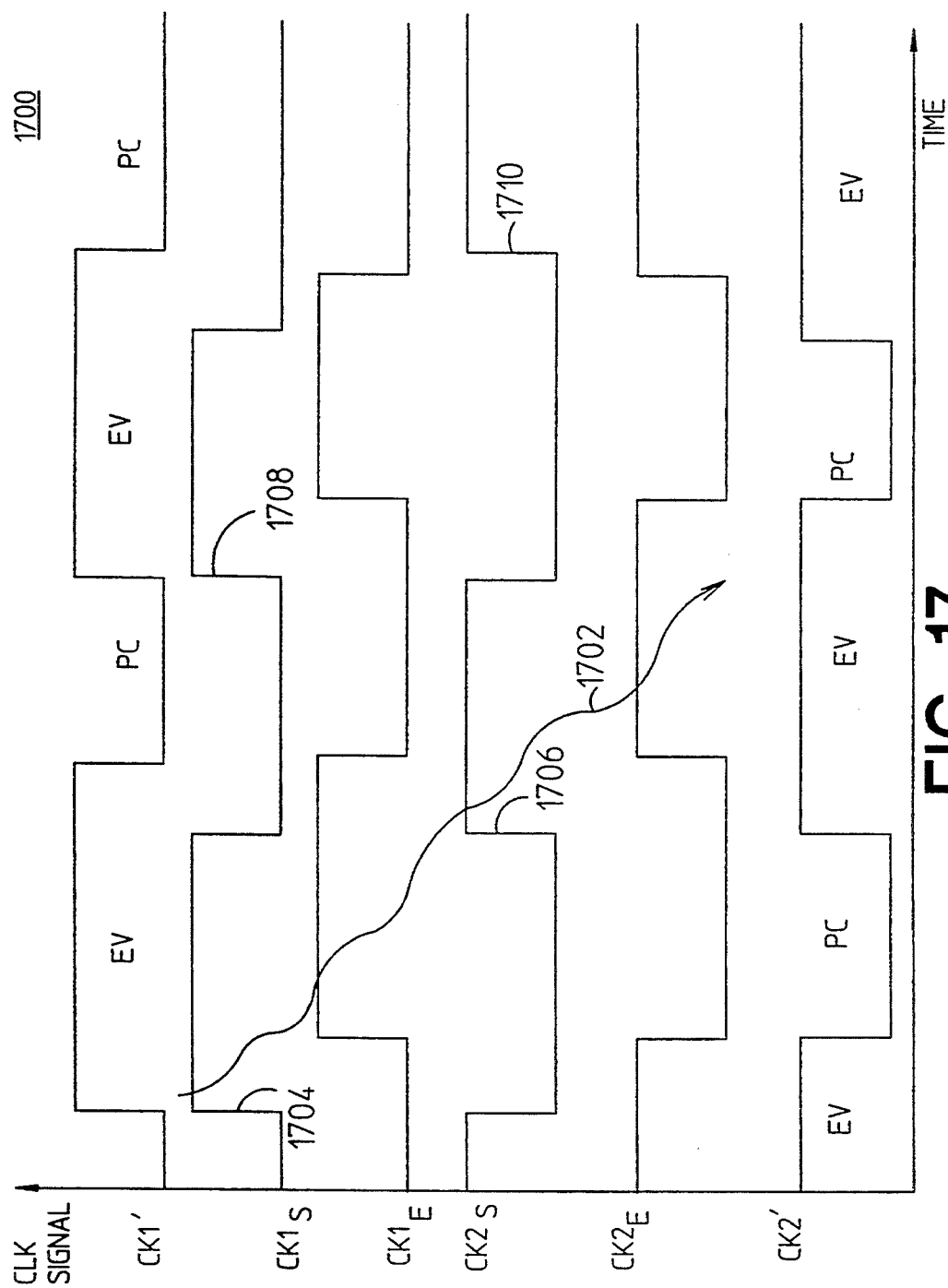
FIG. 17 shows a timing diagram corresponding to FIG. 16.
Figure 18:
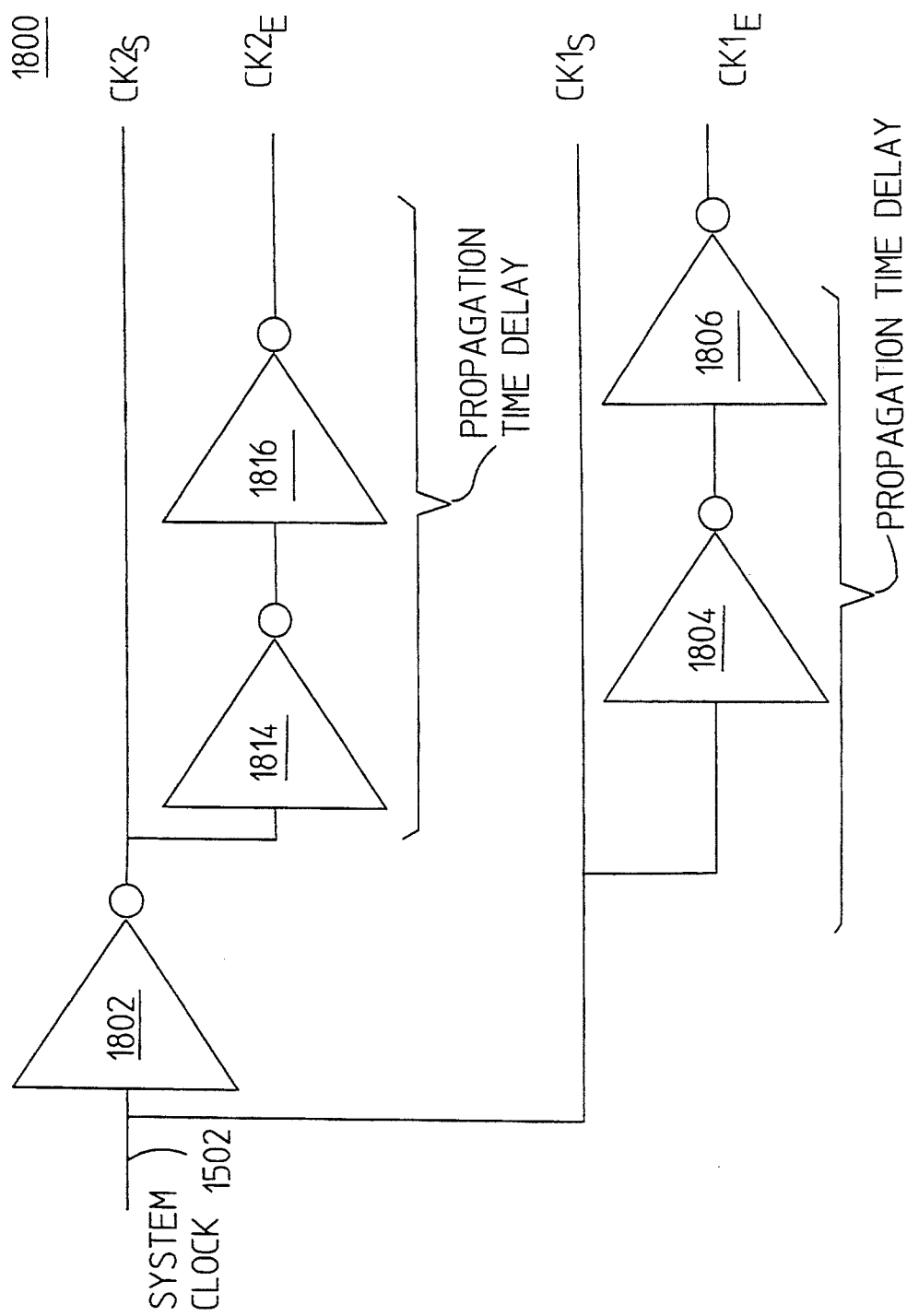
FIG. 18 illustrates a low level block diagram of the architecture for implementing the timing diagram of FIG. 17.

For a clearer understanding of the second preferred embodiment as applied to multiple pipeline stages, FIGS. 16–18 illustrate the preferred clocking scheme as applied to adjacent pipeline stages of the pipeline 800. As shown in FIG. 16 as an example, pipeline stage 802 exhibits the same division of mousetrap logic gates (y gates and z gates) as discussed with respect to FIGS. 13–14. Furthermore, the pipeline stage 804 is divided into a set of 1 mousetrap gates 1602 and m mousetrap logic gates 1604. The numbers 1 and m are arbitrary and could correspond with y and z, respectively, if desired. However, an important aspect of the present invention is that pipeline stages can have varying numbers of cascaded gates, and hence, different evaluation times. Accordingly, y+z need not equal 1+m.

FIG. 17 illustrates a timing diagram for the start clocks $CK1_S$, $CK2_S$ and the end clocks $CK1_E$, $CK2_E$. As a result of the timing of the foregoing clocks, the pipeline stage 802 exhibits an evaluation period and a precharge period as shown by clock CK1' in FIG. 17. Moreover, the pipeline stage 804 exhibits an evaluation and precharge period as shown by CK2' in FIG. 17. The flow of logic evaluations through the pipeline stages can be conceptualized as a ripple, or wave, through the pipeline 800, as indicated by arrow 1702 in FIG. 17. Essentially, logic evaluations in the critical logic path progress in a completely self-timed manner without hindrance of the clocks and with propulsion by the precharging supplied by the clocks.

FIG. 18 illustrates the architecture for generation of the clocks shown in the timing diagram of FIG. 17. As shown in FIG. 18, the start clock $CK1_S$ is derived directly from the system clock 1502. The end clock $CK1_E$ is derived by sending the system clock 1502 through inverters 1804, 1806. Furthermore, the start clock $CK2_S$ is generated by sending the system clock 1502 through an inverter 1802. The end clock $CK2_E$ is derived by passing the system clock through inverters 1802, 1814, 1816.

Preferably, the inverters 1802–1816 of FIG. 18 are CMOSFET inverters. In addition, these CMOSFET inverters may have ratioed PMOSFET to NMOSFET widths so as to further enhance the speed of logic evaluations through the critical logic path, as described hereafter.

Specifically, the rising edge of each clock which triggers the latch output (AND gates 1060, 1066, 1072 of FIG. 10) is designed to rise very quickly. In other words, as shown in FIG. 17, the rising edges 1704, 1708 of start clock $CK1_S$ and also the rising edges 1706, 1710 of start clock $CK2_S$ are designed to be very fast, or "hot", edges. The rationale for the foregoing hot edges is as follows. Optimally, there should be no waiting periods for logic evaluations in the critical logic path. An evaluation period in each pipeline stage 802–808 should be initiated as soon as possible and then a long evaluation period should be provided to complete the requisite logic functionality in that stage. However, sometimes a vector logic signal will reach a latch before the start of the evaluation period corresponding to that latch, and the logic evaluation cannot commence until the rising edge of the corresponding start clock. Hence, it is desirable to provide a fast clock edge for initiating the evaluation period so as to minimize any waiting which might occur in the critical logic path.

To achieve fast rising edges 1704–1710, the architecture 1800 of FIG. 18 is manipulated by ratioing CMOSFET inverters. The fast rising edges 1704, 1708 are generated by the start clock $CK1_S$, which parallels the system clock 1502. Consequently, there is no need to implement inverter ratioing to speed up the rising clock edges. However, the CMOSFET inverter 1802 produces the edges 1706, 1710, which must operate very fast from a logic low to a logic high. In order to effectuate this result, the CMOSFET inverter 1802 is configured so that the ratio of the PMOSFET width to the NMOSFET width is large. Thus, the output ($CK2_S$) of the CMOSFET inverter 1802 rises from a logic low to a logic high very quickly. Worth noting is that the output of the CMOSFET inverter 1802 falls from a logic high to a logic low very slowly, but this predicament is of no significant consequence because there is sufficient time for precharge. Also worth noting is that the implementation of the ratioed widths in regard to CMOSFET inverter 1802 minimizes the load on the system clock 1502.

C. Third Preferred Embodiment

Figure 19:
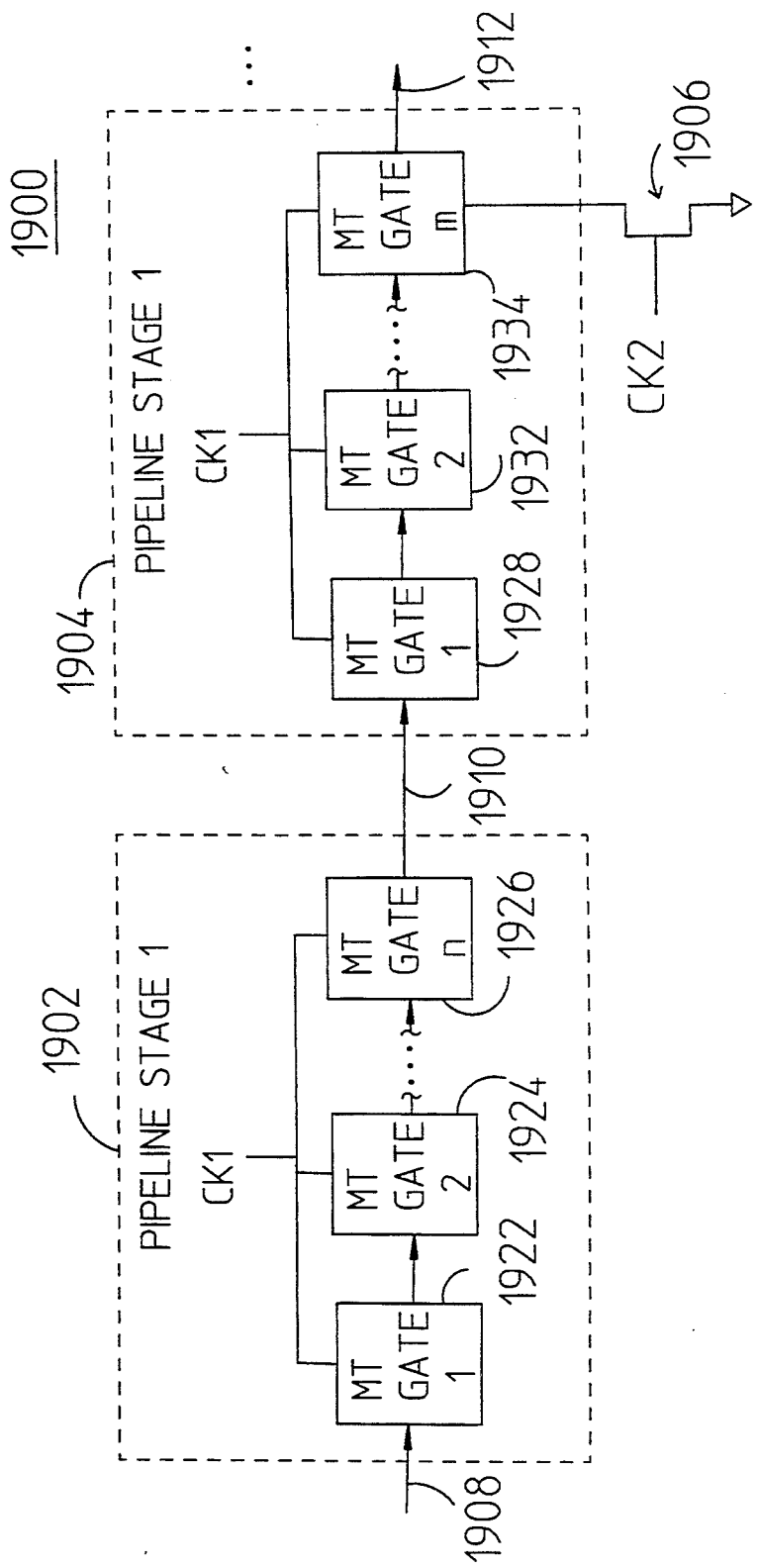
FIG. 19 illustrates a high level block diagram of the third preferred embodiment of the present invention wherein the self-timed pipeline stages are cascaded without interposing latches between stages.

In accordance with a third preferred embodiment of the present invention, a pipeline 1900 of FIG. 19 is constructed without latches between the N number of pipeline stages 1902, 1904. This configuration is possible because of the self-timed nature of logic evaluations progressing through the pipeline 1900. Each pipeline stage 1902, 1904 knows when an input is valid and its value when it is valid.

As shown in FIG. 19, any number N of pipeline stages 1902, 1904 may be cascaded in series. The N pipeline stages 1902, 1904 are alternately clocked with the clocks CK1 and CK2 as described with respect to the first preferred embodiment of the present invention. Further, each of the pipeline stages is preferably individually clocked with a start clock $CKx_S$ and an end clock $CKx_E$, where x is 1 or 2, in accordance with the second preferred embodiment. Moreover, each of the individual pipeline stages 1902, 1904 can have any number n, m, respectively, of cascaded mousetrap logic gates, as shown in FIG. 1.

The N pipeline stages 1902, 1904 of FIG. 19 are constructed so that the vector outputs are guaranteed to eventually transition to an invalid state, i.e., all vector components to a logic low, irrespective of whether any inputs (vectors or vector components) remain or transition to a logic high while the corresponding pipeline stage is in its precharge period. If logic evaluations progress through the pipeline 1900 without implementation of the preceding constraint, a first pipeline operation initiated at a time t may interfere with a later pipeline operation commenced at a time t+delta t.

Worth mentioning is that the AND gates 1060, 1066, 1072 of the pipeline latch 1000 of FIG. 10 eliminated the foregoing constraint. However, also worth noting is that this constraint is usually accommodated for by most pipeline stages 1902, 1904 because a sufficient number of the cascaded mousetrap gates will have clocked-triggered pull-down transistors for disabling the corresponding ladder logics or some other clock-triggered gating means for disabling the pipeline stage outputs. The foregoing concept was described previously with respect to FIG. 1.

In order to force this constraint for the purpose of reliability, only a minor modification need be implemented in the pipeline 1900. A clock-triggered gating means, for example, a pull-down transistor 1906, is disposed at pipeline stages after the first one or more. By not implementing the clock-triggered gating means in the early pipeline stages, such as pipeline stage 1 denoted by reference numeral 1902, early data arriving from other circuits (not shown) can ripple through pipeline stage 1 into the initial mousetrap gates of the subsequent pipeline stage 2, denoted by reference numeral 1904, in a manner unimpeded by the precharge clock of stage 1. This allows for pre-evaluation of the data and enhances speed. Finally, the foregoing modification adds little complexity to the pipeline 1900, and furthermore, allows for the maximum time-stealing advantages.

It should be noted that this third embodiment does not yet provide for operation below a minimum clock frequency. If this provision is required, the re-introduction of either the first or second pipeline latch embodiments between the pipeline stages, without the output gating mechanism 1010, 1110, will satisfy this requirement while preserving the other features of the third preferred embodiment.

The foregoing description of the preferred embodiments of the present invention has been presented for purposes of illustration and description. It is not intended to be exhaustive or to limit the present invention to the precise forms disclosed, and obviously many modifications are possible in light of the above teachings. All such modifications are intended to be incorporated herein.

Wherefore, we claim the following inventions:

1. A system for optimizing a flow of logic evaluations through a series of pipeline stages having self-timed dynamic logic gates, the system comprising:
   a first clock signal having a first clock evaluation state and a first clock precharge state of shorter time duration;
   a second clock signal having a second clock evaluation state and a second clock precharge state of shorter duration, said second clock precharge state existing during said first clock evaluation state;
   a first stage of self-timed dynamic logic gates for receiving data and said first clock signal, said first clock precharge state for precharging said self-timed dynamic logic gates of said first stage, said first clock evaluation state for permitting self-timed logic evaluation of said data in said first stage after precharge; and
   a second stage of self-timed dynamic logic gates for receiving said data from said first stage and for receiving said second clock signal, said second clock precharge state for precharging said self-timed dynamic logic gates of said second stage, said second clock evaluation state for permitting self-timed evaluation of said data in said second stage after precharge,
   wherein said self-timed dynamic logic gates comprise:
   logic for performing logic evaluations on said data;
   an inverting buffer connected to said logic, said inverting buffer for providing a logic gate output, said logic gate output triggered from a low logic state to a high logic state by said logic; and
   an arming mechanism adapted to periodically precharge an input of said inverting buffer to thereby cause said inverting buffer to maintain said buffer output at a low logic state until triggered by said logic.

2. The system of claim 1, wherein said data comprises vector logic signals.

3. The system of claim 1, further comprising a plurality of logic paths configured to encode said data in the form of vector logic and further comprising vector component logic corresponding to each of said logic paths.

4. The system of claim 1, further comprising:
   at least one clock-triggered gate coupled to a last self-timed dynamic logic gate of the second stage, to force an output of the second stage to an invalid-vector logic state, based on the second clock signal.

5. The system of claim 1, wherein the second clock signal is predetermined to be different from the first clock signal.

6. A system for optimizing a flow of logic evaluations through a series of pipeline stages having self-timed dynamic logic gates, the system comprising:
   a first clock signal having a first clock evaluation state and a first clock precharge state of shorter time duration;
   a second clock signal having a second clock evaluation state and a second clock precharge state of shorter duration, said second clock precharge state existing during said first clock evaluation state;
   a first stage of self-timed dynamic logic gates for receiving data and said first clock signal, said first clock precharge state for precharging said self-timed dynamic logic gates of said first stage, said first clock evaluation state for permitting self-timed logic evaluation of said data in said first stage;
   a latch for receiving said data from said first stage and for receiving said second clock signal; and
   a second stage of self-timed dynamic logic gates for receiving said data from said latch and for receiving said second clock signal, said second clock precharge state for precharging said self-timed dynamic logic gates of said second stage, said second clock evaluation state for permitting self-timed evaluation of said data in said second stage, wherein said self-timed dynamic logic gates comprise:

logic for performing logic evaluations on said data;

an inverting buffer connected to said logic, said inverting buffer for providing a logic gate output, said logic gate output triggered from a low logic state to a high logic state by said logic; and an arming mechanism adapted to periodically precharge an input of said inverting buffer to thereby cause said inverting buffer to maintain said buffer output at a low logic state until triggered by said logic.

7. The system of claim 6, wherein said data comprises vector logic signals.

8. The system of claim 6, wherein said data comprises vector logic signals and wherein said latch comprises:

an input trigger means for receiving said vector logic signals;

a flip-flop means responsive to said input trigger means, said flip-flop means for storing said vector logic signals;

an output gating means responsive to said flip-flop means pursuant to a clock, said output gating means for outputting said vector logic signals;

a latch enable pull-up means for enabling said input trigger means pursuant to said clock;

an input trigger disabling means for disabling said input trigger means pursuant to said clock; and a latch reset means for receiving said vector logic signals and for triggering said input trigger disabling means.

9. The system of claim 6, further comprising:

at least one clock-triggered gate coupled to a last self-timed dynamic logic gate of the second stage, to force an output of the second stage to an invalid vector logic state, based on the second clock signal.

10. The system of claim 6, wherein the second clock signal is predetermined to be different from the first clock signal.

11. A system directed to a pipeline stage having self-timed dynamic logic gates for optimizing a flow of logic evaluations through a series of pipeline stages, the system comprising:

a clock signal having a first clock evaluation state and a first clock precharge state;

a delayed clock signal having a second clock evaluation state which overlaps with said first clock evaluation state, and a second precharge state;

a stage of self-timed dynamic logic gates for receiving data, said stage having a first group of cascaded gates connected to said clock signal and a successive second group of cascaded gates connected to said delayed clock signal;

said clock signal and said delayed clock signal configured to permit parallel precharge of said first and second groups, said clock signal configured to permit self-timed logic evaluation in said first group directly after precharge, said delayed clock signal configured to permit self-timed logic evaluation in said second group at a predetermined period after precharge;

wherein said self-timed dynamic logic gates comprise:

logic for performing logic evaluations on said data;

an inverting buffer connected to said logic, said inverting buffer for providing a logic gate output, said logic gate output triggered from a low logic state to a high logic state by said logic; and an arming mechanism adapted to periodically precharge an input of said inverting buffer to thereby cause said inverting buffer to maintain said buffer output at a low logic state until triggered by said logic.

12. The system of claim 11, wherein said clock signal and said delayed clock signal comprise an evaluation state and a precharge state applied for equivalent time periods.

13. The system of claim 11, wherein the delayed clock signal is predetermined to be delayed relative to the clock signal.

* * * * *